US012787161B2

(12) United States Patent
Ortiz et al.

(10) Patent No.: US 12,787,161 B2
(45) Date of Patent: Nov. 3, 2026

(54) FLEXIBLE INTERCONNECT CIRCUITS AND METHODS OF FABRICATION THEREOF

(71) Applicant: CelLink Corporation, San Carlos, CA (US)

(72) Inventors: Jean-Paul Ortiz, White Lake, MI (US); Malcolm Parker Brown, Mountain View, CA (US); Mark Terlaak, San Carlos, CA (US); Will Findlay, San Carlos, CA (US); Kevin Michael Coakley, Belmont, CA (US); Casey Anderson, San Carlos, CA (US)

(73) Assignee: CelLink Corporation, San Carlos, CA (US)

( * ) Notice: Subject to any disclaimer, the term of this patent is extended or adjusted under 35 U.S.C. 154(b) by 173 days.

(21) Appl. No.: 18/656,082

(22) Filed: May 6, 2024

(65) Prior Publication Data

US 2024/0292527 A1 Aug. 29, 2024

Related U.S. Application Data

(63) Continuation of application No. 18/351,437, filed on Jul. 12, 2023, now Pat. No. 12,010,792, which is a (Continued)

(51) Int. Cl.
*H05K 1/02* (2006.01)
*H05K 3/02* (2006.01)

(52) U.S. Cl.
CPC ........... *H05K 1/028* (2013.01); *H05K 1/0296* (2013.01); *H05K 3/02* (2013.01); *H05K 2201/055* (2013.01)

(58) Field of Classification Search
CPC ........ H05K 1/02; H05K 1/028; H05K 1/0296; H05K 1/189; H05K 3/02; H05K 3/326

(Continued)

(56) References Cited

U.S. PATENT DOCUMENTS 3,750,278 A 8/1973 Oberg et al.
4,818,840 A 4/1989 Booth et al.

(Continued)

FOREIGN PATENT DOCUMENTS

CN 1113595 A 12/1995
CN 101448358 A 6/2009

(Continued)

OTHER PUBLICATIONS

U.S. Appl. No. 18/172,781, Ex Parte Quayle mailed May 25, 2023, 20 pgs.

(Continued)

*Primary Examiner* — Tremesha W Burns
(74) *Attorney, Agent, or Firm* — Polygon IP, LLP

(57) ABSTRACT

Provided are flexible interconnect circuit assemblies and methods of fabricating thereof. In some examples, a flexible interconnect circuit comprises multiple circuit portions, which are monolithically integrated. During the fabrication, some of these circuit portions are folded relative to other portions, forming a stack in each fold. For example, the initial orientation of these portions can be selected such that smaller sheets can be used for circuit fabrication. The portions are then unfolded into the final design configuration. In some examples, the assembly also comprises a bonding film and a temporary support film attached to the bonding film such that the two circuit portions at least partially overlap with the bonding film and are positioned between the bonding film and temporary support film. In some examples, at least some circuit portions extend past the boundary of the bonding film and are coupled to connectors.

20 Claims, 24 Drawing Sheets

Related U.S. Application Data continuation of application No. 18/172,781, filed on Feb. 22, 2023, now Pat. No. 11,751,328.

(60) Provisional application No. 63/268,358, filed on Feb. 22, 2022, provisional application No. 63/363,032, filed on Apr. 15, 2022, provisional application No. 63/373,829, filed on Aug. 29, 2022.

(58) Field of Classification Search
USPC .......................................................... 174/254
See application file for complete search history.

(56) References Cited

U.S. PATENT DOCUMENTS

| | | | |
|---|---|---|---|
| 5,262,594 | A | 11/1993 | Edwin et al. |
| 5,645,932 | A | 7/1997 | Uchibori |
| 6,010,771 | A | 1/2000 | Isen et al. |
| 6,036,809 | A | 3/2000 | Kelly et al. |
| 6,274,822 | B1 | 8/2001 | Light et al. |
| 6,332,909 | B1 | 12/2001 | Teshima et al. |
| 6,420,659 | B1 | 7/2002 | Tsutsumi et al. |
| 6,787,732 | B1 | 9/2004 | Xuan et al. |
| 6,881,923 | B2 | 4/2005 | Battaglia |
| 6,992,001 | B1 | 1/2006 | Lin |
| 7,497,004 | B2 | 3/2009 | Cote et al. |
| 7,593,085 | B2 | 9/2009 | Watanabe et al. |
| 7,633,035 | B2 | 12/2009 | Kirmeier |
| 8,510,934 | B2 | 8/2013 | Van Den et al. |
| 8,931,166 | B2 | 1/2015 | Marttila |
| 8,975,510 | B2 | 3/2015 | Coakley |
| 9,147,875 | B1 | 9/2015 | Coakley et al. |
| 9,214,607 | B1 | 12/2015 | Andrews |
| 9,466,777 | B2 | 10/2016 | Coakley et al. |
| 9,468,090 | B2 | 10/2016 | Sabavat et al. |
| 9,671,352 | B2 | 6/2017 | Woo et al. |
| 9,692,030 | B2 | 6/2017 | Schüssler et al. |
| 9,730,333 | B2 | 8/2017 | Li et al. |
| 10,008,403 | B2 | 6/2018 | Rumsby et al. |
| 10,153,570 | B2 | 12/2018 | Coakley et al. |
| 10,211,443 | B2 | 2/2019 | Coakley et al. |
| 10,383,207 | B2 | 8/2019 | Coakley |
| 10,694,618 | B2 | 6/2020 | Coakley et al. |
| 11,108,175 | B2 | 8/2021 | Coakley et al. |
| 11,116,070 | B2 | 9/2021 | Coakley et al. |
| 11,545,773 | B2 | 1/2023 | Coakley et al. |
| 11,751,328 | B1 | 9/2023 | Ortiz et al. |
| 11,791,577 | B2 | 10/2023 | Coakley et al. |
| 11,950,377 | B1 | 4/2024 | Ortiz et al. |
| 12,010,792 | B2 | 6/2024 | Ortiz et al. |
| 2001/0006766 | A1 | 7/2001 | O'Brien et al. |
| 2002/0046856 | A1 | 4/2002 | Alcoe |
| 2002/0050489 | A1 | 5/2002 | Ikegami et al. |
| 2003/0062347 | A1 | 4/2003 | Song et al. |
| 2006/0032665 | A1 | 2/2006 | Ice |
| 2007/0171129 | A1 | 7/2007 | Coleman et al. |
| 2007/0193027 | A1 | 8/2007 | Takakusaki et al. |
| 2008/0017971 | A1 | 1/2008 | Hollis |
| 2008/0083715 | A1 | 4/2008 | Kirmeier |
| 2008/0128397 | A1 | 6/2008 | Gandhi |
| 2009/0007421 | A1 | 1/2009 | Chen et al. |
| 2010/0031996 | A1 | 2/2010 | Basol |
| 2010/0188826 | A1 | 7/2010 | Yeh |
| 2011/0001670 | A1 | 1/2011 | Coleman et al. |
| 2011/0089212 | A1 | 4/2011 | Schmid et al. |
| 2012/0021621 | A1 | 1/2012 | Kim |
| 2012/0164490 | A1 | 6/2012 | Itoi et al. |
| 2012/0171527 | A1 | 7/2012 | Hiroma |
| 2012/0227907 | A1 | 9/2012 | Arakawa et al. |
| 2013/0055555 | A1 | 3/2013 | Forster et al. |
| 2013/0170155 | A1 | 7/2013 | Kashiwakura |
| 2013/0260191 | A1 | 10/2013 | Takahashi et al. |
| 2014/0131071 | A1 | 5/2014 | Tanaka et al. |
| 2014/0268780 | A1 | 9/2014 | Wang et al. |
| 2014/0307423 | A1 | 10/2014 | Coats |
| 2015/0023584 | A1 | 1/2015 | Rudin |
| 2015/0228956 | A1 | 8/2015 | Schüssler et al. |
| 2015/0270190 | A1 | 9/2015 | Kim et al. |
| 2015/0327368 | A1 | 11/2015 | Su et al. |
| 2016/0181579 | A1 | 6/2016 | Geshi et al. |
| 2016/0207287 | A1 | 7/2016 | Kim |
| 2016/0315304 | A1 | 10/2016 | Biskup |
| 2016/0366768 | A1 | 12/2016 | Matsuda |
| 2017/0012331 | A1 | 1/2017 | Ng et al. |
| 2017/0214033 | A1 | 7/2017 | Takano et al. |
| 2018/0034023 | A1 | 2/2018 | Newman et al. |
| 2018/0205048 | A1 | 7/2018 | Enomoto et al. |
| 2018/0294536 | A1 | 10/2018 | Kruszelnicki |
| 2019/0043747 | A1 | 2/2019 | Malatkar et al. |
| 2019/0097204 | A1 | 3/2019 | Liposky et al. |
| 2019/0181419 | A1 | 6/2019 | Suba et al. |
| 2019/0218142 | A1 | 7/2019 | Logunov et al. |
| 2019/0296281 | A1 | 9/2019 | Elsberry |
| 2019/0312251 | A1 | 10/2019 | Matthews |
| 2019/0341585 | A1 | 11/2019 | Shi et al. |
| 2020/0137882 | A1 * | 4/2020 | Coakley ............... H05K 1/0225 |
| 2020/0220120 | A1 | 7/2020 | Day et al. |
| 2022/0109256 | A1 | 4/2022 | Coakley et al. |
| 2022/0109258 | A1 | 4/2022 | Coakley et al. |
| 2022/0311103 | A1 | 9/2022 | Findlay et al. |
| 2023/0269870 | A1 | 8/2023 | Ortiz |
| 2023/0371174 | A1 | 11/2023 | Ortiz et al. |
| 2024/0215173 | A1 | 6/2024 | Ortiz et al. |

FOREIGN PATENT DOCUMENTS

| | | | |
|---|---|---|---|
| CN | 102348340 | A | 2/2012 |
| CN | 202455644 | U | 9/2012 |
| CN | 203715762 | U | 7/2014 |
| CN | 107004617 | A | 8/2017 |
| CN | 109509591 | A | 3/2019 |
| CN | 113228831 | A | 8/2021 |
| CN | 118743316 | A | 10/2024 |
| EP | 0675567 | A2 | 10/1995 |
| EP | 0675567 | B1 | 10/1995 |
| EP | 0694927 | A1 | 1/1996 |
| EP | 3496180 | A1 | 6/2019 |
| EP | 4442087 | B2 | 10/2024 |
| JP | H07320545 | A | 12/1995 |
| JP | 2008146944 | A1 | 6/2008 |
| JP | 2008146944 | B | 6/2008 |
| JP | 2008159908 | A | 7/2008 |
| JP | 2008199849 | A | 8/2008 |
| KR | 20150058939 | A | 5/2015 |
| WO | 2019150740 | A1 | 8/2019 |
| WO | PCTUS2363039 | | 2/2023 |
| WO | 2023164486 | A1 | 8/2023 |

OTHER PUBLICATIONS

U.S. Appl. No. 18/172,781, Notice of Allowance mailed Jun. 20, 2023, 5 pgs.

U.S. Appl. No. 18/351,437, Notice of Allowance mailed Feb. 5, 2024, 9 pgs.

International Application Serial No. PCT/US23/63039, Search Report and Written Opinion mailed Jun. 19, 2023, 10 pgs.

Nagarajan Palavesam et al; "Roll-to-roll processing of film substrates for hybrid integrated flexible electronics" Flexible and Printed Electronics, Feb. 2018.

Chinese Application Serial No. 2023800229291, Office Action mailed Mar. 28, 2025, 9 pgs.

European Application Serial No. 23760878.1, Search Report and Written Opinion mailed Mar. 10, 2026, 25 pgs.

European Application No. 23760878.1, Search Report and Search Opinion dated Jun. 5, 2026.

* cited by examiner

FLEXIBLE INTERCONNECT CIRCUITS AND METHODS OF FABRICATION THEREOF

CROSS-REFERENCE TO RELATED APPLICATIONS

This application is a continuation of U.S. patent application Ser. No. 18/351,437 by Jean-Paul Ortiz, et al., entitled: "Flexible Interconnect Circuits and Methods of Fabrication Thereof", filed on 2023 Jul. 12, which is a continuation of U.S. patent application Ser. No. 18/172,781 by Jean-Paul Ortiz, et al., entitled: "Flexible Interconnect Circuits and Methods of Fabrication Thereof", filed on 2023 Feb. 22, now issued as U.S. Pat. No. 11,751,328 on 2023 Sep. 5, which claims the benefit under 35 U.S.C. § 119(e) of (1) U.S. Provisional Patent Application No. 63/268,358 by Jean-Paul Ortiz, et al., entitled: "Folded Arrangements of Flexible interconnect Circuits and Methods of Fabricated Thereof", filed on 2022 Feb. 22, (2) U.S. Provisional Patent Application No. 63/363,032 by Jean-Paul Ortiz, et al., entitled: "Flexible Interconnect Circuits with Integrated Circuit Elements", filed on 2022 Apr. 15, and (3) U.S. Provisional Patent Application No. 63/373,829 by Mark Terlaak, et al., entitled: "Molded Seal Interconnect Harness", filed on 2022 Aug. 29, all of which are incorporated herein by reference in its entirety for all purposes.

BACKGROUND

Electrical power and control signals are typically transmitted to individual components (e.g., in a vehicle or any other machinery or system) using multiple wires bundled together in a harness. While flat flexible interconnect circuits are gaining traction for such applications, forming such circuits requires large sheets of metal foil and insulators most of these materials are being wasted. Furthermore, transporting and installing flexible interconnect circuits can be challenging due to their large flat arrangements.

What is needed are novel flexible interconnect circuits that are folded into specific configurations thereby reducing the material waste during fabrication and/or also improving the installation efficiency.

SUMMARY

Provided are flexible interconnect circuit assemblies and methods of fabricating thereof. In some examples, a flexible interconnect circuit comprises multiple circuit portions, which are monolithically integrated. During the fabrication, some of these circuit portions are folded relative to other portions, forming a stack in each fold. For example, the initial orientation of these portions can be selected such that smaller sheets can be used for circuit fabrication. The portions are then unfolded into the final design configuration. In some examples, the assembly also comprises a bonding film and a temporary support film attached to the bonding film such that the two circuit portions at least partially overlap with the bonding film and are positioned between the bonding film and the temporary support film. In some examples, at least some circuit portions extend past the boundary of the bonding film and are coupled to connectors.

Provided is a method of forming a flexible interconnect circuit assembly. In some examples, the method comprises providing a flexible interconnect circuit comprising a first circuit portion and a second circuit portion monolithically integrated with the first circuit portion. Each of the first circuit portion and the second circuit portion is an elongated structure extending parallel to a primary axis of the flexible interconnect circuit. Each of the first circuit portion and the second circuit portion comprises a first side and a second side opposite the first side. The first side of the first circuit portion and the first side of the second circuit portion face in the same direction. The method also comprises folding the second circuit portion relative to the first circuit portion such that the second circuit portion is no longer parallel to the primary axis of the flexible interconnect circuit and such that the second side of the first circuit portion and the second side of the second circuit portion face in opposite directions after folding. The method also comprises attaching a bonding film to the second side of the first circuit portion and the first side of the second circuit portion and attaching a temporary support film to the bonding film such that the first side of the first circuit portion and the second side of the second circuit portion faces the temporary support film.

In some examples, the first circuit portion terminates with a first connector. The first connector and a part of the first circuit portion, which is adjacent to the first connector, extend outside the boundary of the bonding film. In some examples, the first connector and the portion of the first circuit portion adjacent to the first connector overlap with the boundary of the temporary support film.

In some examples, before folding, the first circuit portion and the second circuit portion are coplanar. In the same or other examples, after folding, a part of the first side of the first circuit portion directly interfaces with a part of the first side of the second circuit portion.

In some examples, the first side of the first circuit portion and the first side of the second circuit portion is formed by a first insulating layer, which is monolithic. The second side of the first circuit portion and the second side of the second circuit portion is formed by a second insulating layer, which is monolithic and bonded to the first insulating layer. In more specific examples, each of the first circuit portion and second circuit portion comprises one or more conductive traces, positioned between the first insulating layer and the second insulating layer such that the first insulating layer and the second insulating layer are bonded together around the one or more conductive traces. In some examples, providing the flexible interconnect circuit comprises forming one or more conductive traces of the first circuit portion and second circuit portion by patterning a metal foil.

In some examples, the first circuit portion and a second circuit portion form a primary circuit portion. The flexible interconnect circuit comprises support tabs, each formed by at least the first insulator layer and the second insulator layer and extending from an edge of the primary circuit portion and monolithic with the primary circuit portion. Each of the support tabs comprises a support-tab opening for receiving a fastener when securing the flexible interconnect circuit.

In more specific examples, the flexible interconnect circuit comprises conductive traces and a support component, which are formed from the same conductive materials and have the same thicknesses. The conductive traces are at least partially positioned between the first insulator layer and the second insulator layer in the primary circuit portion. The support component is at least partially positioned between the first insulator layer and the second insulator layer in the support tab and is used to reinforce the support tab providing additional strength. In some examples, the support component is electrically isolated from each of the conductive traces. Alternatively, the support component is monolithic with at least one of the conductive traces. In some examples, the second insulator layer comprises a second-insulator opening that is larger and concentric with the support-tab opening. The second insulator layer at least partially exposes the support component.

In some examples, the first circuit portion and the second circuit portion, extending parallel to each other, are separated by a slit. In the same or other examples, the method further comprises arranging the flexible interconnect circuit into a shipping configuration selected from the group consisting of a planar sheet and a roll, wherein the roll comprises additional flexible interconnect circuits.

In some examples, a flexible interconnect circuit assembly comprises a flexible interconnect circuit comprising a first circuit portion and a second circuit portion monolithically integrated with the first circuit portion. Each of the first circuit portion and the second circuit portion comprises a first side and a second side opposite the first side. The first side of the first circuit portion and the first side of the second circuit portion is formed by a first insulating layer. The second side of the first circuit portion and the second side of the second circuit portion is formed by a second insulating layer, bonder to the first insulating layer. The second circuit portion is folded relative to the first circuit portion such that the second circuit portion is not parallel to the second circuit portion and such that the first side of the first circuit portion and the first side of the second circuit portion face in opposite directions. The flexible interconnect circuit assembly also comprises a bonding film attached to the second side of the first circuit portion and the first side of the second circuit portion and a temporary support film attached to the bonding film such that the first side of the first circuit portion and the second side of the second circuit portion faces the temporary support film.

In some examples, the flexible interconnect circuit assembly further comprises the first circuit portion, which terminates with a first connector. The first connector and a part of the first circuit portion adjacent to the first connector extend outside the boundary of the bonding film. The first connector and the portion of the first circuit portion adjacent to the first connector overlap with the boundary of the temporary support film. In some examples, the first side of the first circuit portion and the first side of the second circuit portion is formed by a first insulating layer, which is monolithic. The second side of the first circuit portion and the second side of the second circuit portion is formed by a second insulating layer, which is monolithic and bonded to the first insulating layer. In more specific examples, each of the first circuit portion and second circuit portion comprises one or more conductive traces, positioned between the first insulating layer and the second insulating layer such that the first insulating layer and the second insulating layer are bonded together around the one or more conductive traces.

DETAILED DESCRIPTION

Figure 1A:
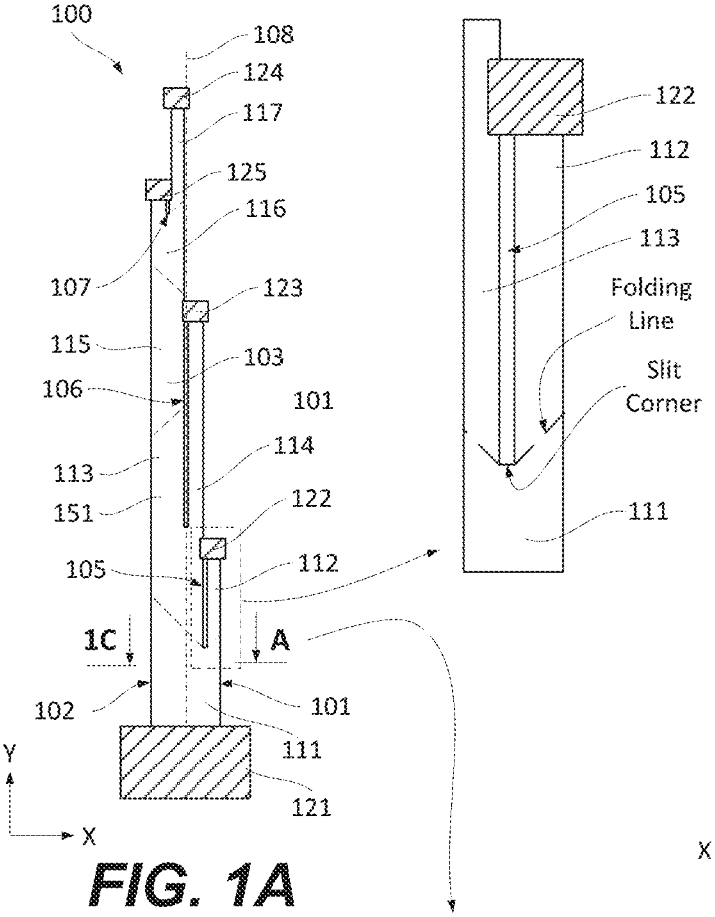
FIG. 1A is a schematic planar view of a flexible interconnect circuit in a pre-folded state with a first side facing up, in accordance with some examples.

In the following description, numerous specific details are outlined to provide a thorough understanding of the presented concepts. In some examples, the presented concepts are practiced without some or all of these specific details. In other examples, well-known process operations have not been described in detail to unnecessarily obscure the described concepts. While some concepts will be described in conjunction with specific examples, it will be understood that these examples are not intended to be limiting.

Flexible interconnect circuits are used to deliver power and/or signals and are used for various applications, such as vehicles, appliances, electronics, and the like. One example of such flexible interconnect circuits is a harness. As noted above, a conventional harness uses a stranded set of small round wires. A separate polymer shell insulates each wire, adding to the size and weight of the harness. Unlike conventional harnesses, flexible interconnect circuits described herein have thin flat profiles, enabled by thin electrical conductors that can be positioned side-by-side. Each electrical conductor can have a flat rectangular profile. In some examples, electrical conductors (positioned next to each other) are formed from the same metal sheet (e.g., foil). For purposes of this disclosure, the term "interconnect" is used interchangeably with "interconnect circuit", the term "conductive layer"—with "conductor" or "conductor layer", and the term "insulating layer"—with "insulator".

FIGS. 1A-4B: Examples of Flexible Interconnect Circuit Assemblies

As noted above, fabricating flat flexible interconnect circuits solved many problems associated with conventional wire harnesses but causes significant material waste. For example, the overall boundary of an interconnect circuit can be much larger than the area occupied by the actual physical portions of the circuit (e.g., conductive traces). This limitation is caused by conventional methods of manufacturing interconnect circuits, i.e., starting with sheets of materials that extend the entire circuit boundary and removing (e.g., scrapping) the unused portions.

Flexible interconnect circuit assemblies, described herein, are fabricated by folding different circuit portions relative to each other. For example, two circuit portions can be initially parallel and next to each other. One circuit portion can be folded such that it extends in a different direction, e.g., perpendicular, to the other portion thereby increasing the overall footprint area of interconnect circuit assembly. It should be noted that both circuit portions are formed from the same starting sheets of materials and, therefore, are monolithically integrated. To assist with bonding the circuit assembly to various surfaces (e.g., vehicle panels), the assembly can comprise a bonding film and a temporary support film attached to the bonding film such that the circuit portions at least partially overlap with the bonding film and positioned between the bonding film and temporary support film. In some examples, a part of the first circuit portion extends past the boundary of the bonding film and is coupled to a connector. In other words, an interconnect circuit assembly comprises a flexible interconnect circuit, which is initially fabricated in a pre-folded state thereby reducing the size of materials (e.g., sheets) needed for manufacturing the circuit. The flexible interconnect circuit is then unfolded such that the unfolded state corresponds to the application footprint (greater than the initial fabricating footprint of the flexible interconnect circuit). Additional assembly components are added to the flexible interconnect circuit in the unfolded state forming the assembly.

Figure 1B:
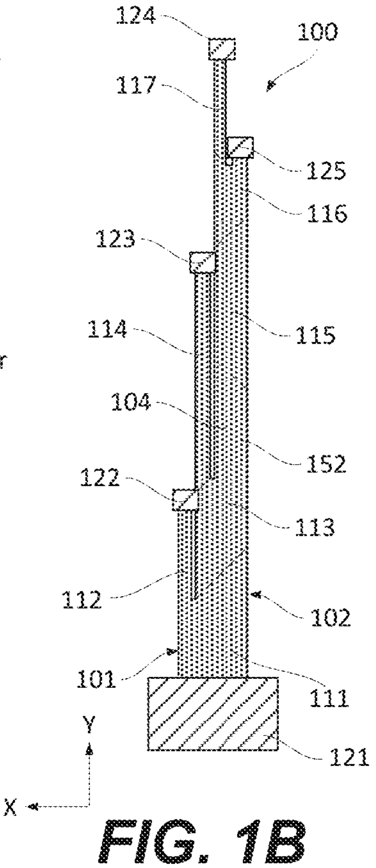
FIG. 1B is a schematic planar view of the flexible interconnect circuit in FIG. 1A, also in a pre-folded state with the first side facing down.

FIG. 1A is a schematic view of flexible interconnect circuit 100 in a pre-folded state with first side 103 facing up, in accordance with some examples. FIG. 1B is a schematic view of flexible interconnect circuit 100 in FIG. 1B with second side 104 (opposite of first side 103) facing up. FIGS. 1A and 1B as well as other figures also identify first edge 101 and second edge 102 to provide the orientation of flexible interconnect circuit 100 and its component in space. The pre-folded state may be also referred to as an as-manufactured state. This state/shape is selected to reduce the material waste during the manufacturing of flexible interconnect circuit 100. FIG. 1D is a schematic view of flexible interconnect circuit 100 in FIGS. 1A and 1B in an unfolded state. The unfolded state is formed by folding various components (circuit portions) of flexible interconnect circuit 100. The unfolded state may be also referred to as an as-installed state, to differentiate from the as-manufactured state (the folded state). If a rectangular boundary (e.g., representing a sheet used for the circuit fabrication) is drawn around flexible interconnect circuit 100 in the pre-folded state (which may be referred to as a pre-folded footprint) and, separately, around flexible interconnect circuit 100 in the unfolded state (which may be referred to as an unfolded footprint), then the area of the unfolded state boundary will be much larger (e.g., 25% larger, 50% larger, or even 100% larger) than the area of the pre-folded state boundary. This boundary area comparison illustrates the corresponding reduction of the material waste associated with manufacturing flexible interconnect circuit 100 in the pre-folded state. Furthermore, folding flexible interconnect circuit 100 allows new orientations of conductive leads in flexible interconnect circuit 100 (e.g., a crossover of conductive leads in the folded state). It should be noted that the crossover of conductive leads is not possible in the pre-folded state since all conductive leads in the same layer are formed from the same sheet of metal as further described below with reference to FIG. 1C.

Referring to FIGS. 1A and 1B, flexible interconnect circuit 100 comprising first circuit portion 111 and second circuit portion 112. First circuit portion 111 and second circuit portion 112 are monolithically integrated by various shared components of flexible interconnect circuit 100 as further described below. First circuit portion 111 and second circuit portion 112 are identified by a folding pattern, e.g., a folding line extending between first circuit portion 111 and second circuit portion 112. Various folding lines are identified in FIGS. 1A and 1B with dashed lines. The example of the folding line between first circuit portion 111 and second circuit portion 112 is presented in an expanded view, provided between FIGS. 1A and 1B. The folding pattern/lines, which are shown in FIG. 1A, defines first circuit portion 111, second circuit portion 112, third circuit portion 113, fourth circuit portion 114, fifth circuit portion 115, sixth circuit portion 116, and seventh circuit portion 117. However, one having ordinary skill in the art would understand that any folding patterns and any number of circuit portions are within the scope.

In some examples, a folding line extends to a slit corner. For example, various slits can be provided in flexible interconnect circuit 100 to facilitate the folding of different circuit portions relative to each other. Specifically, FIG. 1A illustrates an example of flexible interconnect circuit 100 comprising first slit 105 (extending between second circuit portion 112 and third circuit portion 113), second slit 106 (extending between fourth circuit portion 114 and a combination of third circuit portion 113 and fifth circuit portion 115), and third slit 107 (extending between sixth circuit portion 116 and seventh circuit portion 117). One having ordinary skill in the art would understand that flexible interconnect circuit 100 can have any number of slits or no slits at all. For example, a single continuous strip with no slits that be folded one or more times (e.g., to change the direction) as shown by third circuit portion 113 and fifth circuit portion 115. A slit allows branching out of circuit portions. For example, first circuit portion 111 extends to first slit 105, at which point first circuit portion 111 branches out into second circuit portion 112 and third circuit portion 113.

Figure 1C:
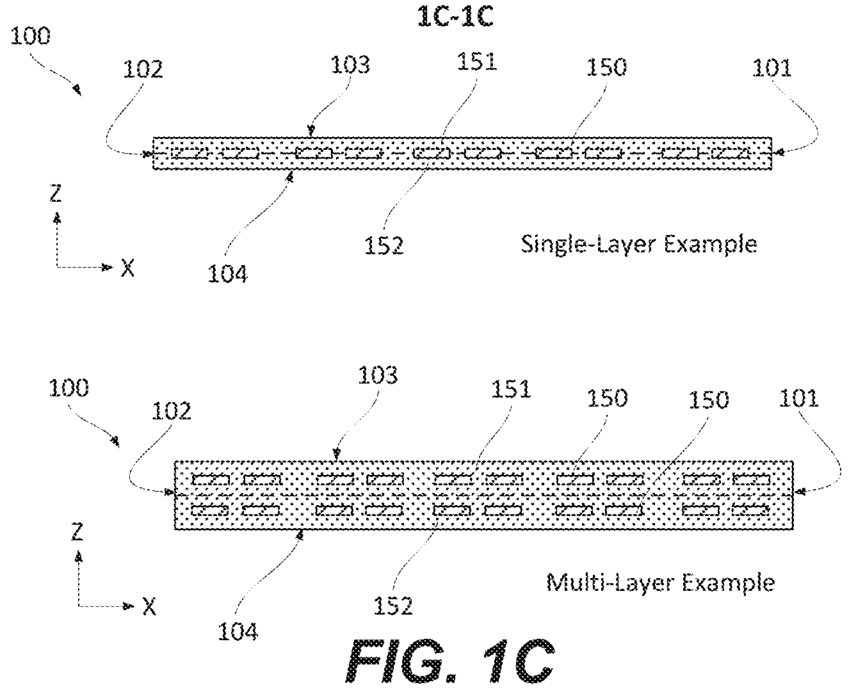
FIG. 1C is a schematic cross-sectional view of the flexible interconnect circuit in FIG. 1A, also in a pre-folded state with the first side facing down.
Figure 1D:
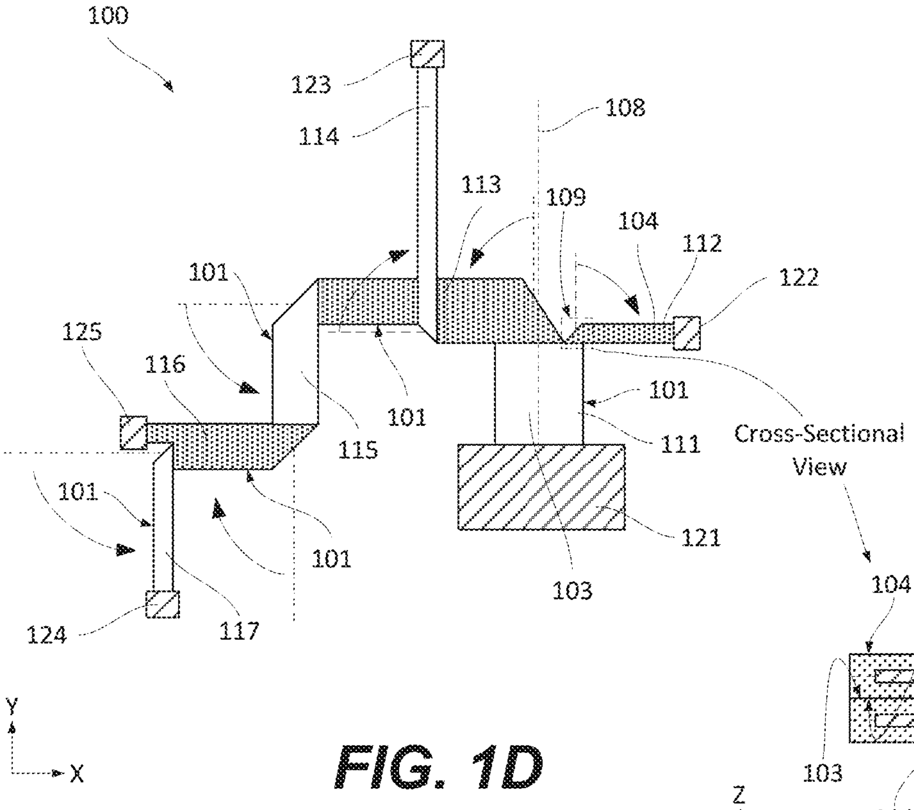
FIG. 1D is a schematic planar view of the flexible interconnect circuit in FIG. 1A in an unfolded state.

Referring to FIGS. 1A-1C, flexible interconnect circuit 100 in a pre-folded state is defined by first side 103 and second side 104. First side 103 is formed by first insulating layer 151, while second side 104 is formed by second insulating layer 152. In some examples, first insulating layer 151 is continuous or, more specifically, monolithic for the entire flexible interconnect circuit 100 and can be referred to as the first monolithic insulating layer. Similarly, second insulating layer 152 can be continuous or, more specifically, monolithic for the entire flexible interconnect circuit 100 and can be referred to as the second monolithic insulating layer. First insulating layer 151 and second insulating layer 152 are bonded together, e.g., laminated, using an adhesive. In some examples, flexible interconnect circuit 100 comprises one or more additional insulating and/or adhesive layers positioned first insulating layer 151 and second insulating layer 152. Referring to FIG. 1C, flexible interconnect circuit 100 also comprises conductive traces 150, which are positioned and sealed (from the environment) between first insulating layer 151 and second insulating layer 152. In some examples, each of first circuit portion 111 and second circuit portion 112 comprises at least one of conductive traces 150.

As such, each of first circuit portion 111 and second circuit portion 112 comprises first side 103 and second side 104, with second side 104 being opposite to first side 103. Specifically, first side 103 of first circuit portion 111 and first side 103 of second circuit portion 112 is formed by first insulating layer 151. In some examples, first insulating layer 151 forms first side 103 of the entire flexible interconnect circuit 100, e.g., first side 103 of all portions of flexible interconnect circuit 100 is formed by first insulating layer 151. As such, all portions of flexible interconnect circuit 100 are monolithically integrated by various components of flexible interconnect circuit 100, e.g., first insulating layer

151, second insulating layer 152, and conductive traces 150. Second side 104 of first circuit portion 111 and second side 104 of second circuit portion 112 is formed by second insulating layer 152.

First insulating layer 151 and second insulating layer 152 provide electrical isolation and mechanical support to conductive traces 150. In some examples, first insulating layer 151 and second insulating layer 152 may initially be processed in a sheet or roll form and may subsequently be laminated to the conductive layer using, for example, adhesive material. First insulating layer 151 and second insulating layer 152 may include (or be formed from) polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), and/or polyvinyl butyral (PVB). Additional aspects (e.g., thicknesses) of first insulating layer 151 and second insulating layer 152 are described below.

In some examples, conductive traces 150 have a uniform thickness throughout the entire circuit boundary. For example, conductive traces 150 can be formed from the same sheet of metal. More specifically, different (disjoint) portions of conductive traces 150 can be formed from the same sheet of metal. In some examples, all conductive traces 150 are formed from the same material, e.g., aluminum, copper, or the like. The use of aluminum (instead of copper) may help with lowering the overall circuit weight and also with lowering the minimum achievable fuse current rating. Specifically, aluminum has a higher resistivity and lower melting temperature than copper. As such, forming fusible links in an aluminum conductive layer may allow for more precise control of the fusible parameters (for the same size tolerance). In general, conductive traces 150 may be formed from any conductive material that is sufficiently conductive (e.g., a conductivity being greater than 10^6 S/m or even greater than 10^7 S/m to allow for current flow through the foil with low power loss.

In some examples, conductive traces 150 may include a surface sublayer or coating for providing a low electrical contact resistance and/or improving corrosion resistance. The surface sublayer may assist with forming electrical interconnections using techniques/materials including, but not limited to, soldering, laser welding, resistance welding, ultrasonic welding, bonding with conductive adhesive, or mechanical pressure. Surface sublayers that may provide a suitable surface for these connection methods include, but are not limited to, tin, lead, zinc, nickel, silver, palladium, platinum, gold, indium, tungsten, molybdenum, chrome, copper, alloys thereof, organic solderability preservative (OSP), or other electrically conductive materials. Furthermore, the surface sublayer may be sputtered, plated, cold-welded, or applied via other means. In some examples, the thickness of the surface sublayer may range from 0.05 micrometers to 10 micrometers or, more specifically, from 0.1 micrometers to 2.5 micrometers. Furthermore, in some examples, the addition of a coating of the OSP on top of the surface sublayer may help prevent the surface sublayer itself from oxidizing over time. The surface sublayer may be used when a base sublayer of conductive traces 150 includes aluminum or its alloys. Without protection, exposed surfaces of aluminum tend to form a native oxide, which is insulating. The oxide readily forms in the presence of oxygen or moisture. To provide a long-term stable surface in this case, the surface sublayer may be resistant to the in-diffusion of oxygen and/or moisture. For example, zinc, silver, tin, copper, nickel, chrome, or gold plating may be used as surface layers on an aluminum-containing base layer.

Referring to FIG. 1C, conductive traces 150 can be arranged in either a single layer or multiple layers. In some examples, conductive traces 150 in different layers are interconnected within flexible interconnect circuit 100. Furthermore, conductive traces 150 in the same layer can be interconnected or even monolithic with each other. It should be noted that conductive traces 150 in the same layer can be formed from the same sheet of metal.

In some examples, a circuit portion has a corresponding connector, e.g., attached at a free end of this portion. For example, first circuit portion 111 terminates with first connector 121, second circuit portion 112 terminates with second connector 122, fourth circuit portion 113 terminates with third connector 123, seventh circuit portion 117 terminates with fourth connector 124, and sixth circuit portion 116 terminates with fifth connector 125. Conductive traces 150 in each circuit portion can be electrically coupled to the conductive leads of the corresponding connector. Furthermore, conductive traces 150 of one circuit portion can extend into another circuit portion. For example, a trace can start at first connector 121 (e.g., connected to a connector terminal in first connector 121) and extend through first circuit portion 111, third circuit portion 113, fifth circuit portion 115, and sixth circuit portion 116 eventually ending at fifth connector 125 (e.g., connected to a connector terminal in fifth connector 125). As such, this conductive trace interconnects the connector terminals in first connector 121 and fifth connector 125).

The relative positions of circuit portions depend on the folding state of flexible interconnect circuit 100. For example, FIGS. 1A and 1B illustrate flexible interconnect circuit 100 in a pre-folded state. In this state/example, all circuit portions extend along the same direction, e.g., parallel to each other/along primary axis 108 of flexible interconnect circuit 100. As noted above, the manufacturing of flexible interconnect circuit 100 in this configuration/state helps to minimize material waste. However, other configurations where circuit portions (while in the pre-folded state) are not all parallel to each other are also within the scope. The pre-folded design is determined based on the unfolded design requirements, folding options, and other factors. Furthermore, all circuit portions can be coplanar in this pre-folded state and do nor overlap and stack. Finally, first sides 103 of all circuit portions face in the same direction (e.g., up in FIG. 1A and down in FIG. 1B) in this pre-folded state. Similarly, second sides 104 of all circuit portions face in the same direction (e.g., down in FIG. 1A and up in FIG. 1B) in this pre-folded state.

When interconnect circuit 100 is folded (from a pre-folded state to an unfolded state), one or more circuit portions change their respective orientation, e.g., as schematically shown in FIG. 1D. In the illustrated example, second circuit portion 112 is folded 90° relative to first circuit portion 111. In other words, first circuit portion 111 is no longer parallel to second circuit portion 112. Any folding angle greater than 0° is within the scope (e.g., between 0° and 180° or, more specifically, between 20° and 160°, or even between 30° and 150°). It should be noted that during this folding, second circuit portion 112 is also flipped relative to first circuit portion 111. Specifically, FIG. 1D illustrates that first side 103 of first circuit portion 111 and second side 104 of second circuit portion 112 are now facing up. The remaining portions are folded similarly, e.g., third circuit portion 113 is folded 90° relative to first circuit portion 111 but in a different direction than second circuit portion 112. As such, in the unfolded state, third circuit portion 113 and second circuit portion 112 extend in different directions. Each fourth circuit portion 114 and fifth circuit portion 115 is folded 90° relative to third circuit portion 113 but in different directions. It should be noted that since (a) third circuit portion 113 is folded relative to first circuit portion 111 and (b) each of fourth circuit portion 114 and fifth circuit portion 115 is folded relative to third circuit portion 113, first side 103 of first circuit portion 111 and first side 103 of each of fourth circuit portion 114 and fifth circuit portion 115 are facing in the same direction (i.e., up in FIG. 1D). Sixth circuit portion 116 is folded 90° relative to fifth circuit portion 115. Finally, seventh circuit portion 117 is folded 90° relative to sixth circuit portion 116. The folding pattern depends on the desired routing of each circuit portion, the position of each connector, and other factors associated with the installation and application of interconnect circuit 100.

Figure 1E:
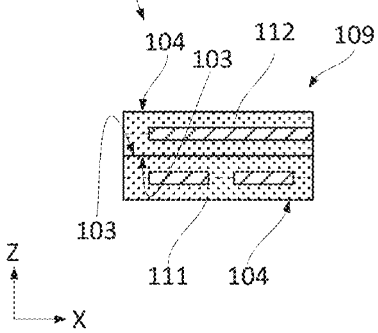
FIG. 1E is a schematic cross-sectional view of a portion of the flexible interconnect circuit in FIG. 1D.

Furthermore, the folding creates a folding corner where first circuit portion 111 and second circuit portion 112 collective form stack 109, which is schematically shown in FIG. 1E. Specifically, in this stack 109, second side 104 of first circuit portion 111 and second side 104 of second circuit portion 112 face in opposite directions. Similarly, first side 103 of first circuit portion 111 and first side 103 of second circuit portion 112 face in opposite directions. Furthermore, within stack 109, first side 103 of first circuit portion 111 and first side 103 of second circuit portion 112 face each other and even interface with each other (e.g., glued to each other to preserve this orientation). The same or similar corners exist at each fold.

Figure 2A:
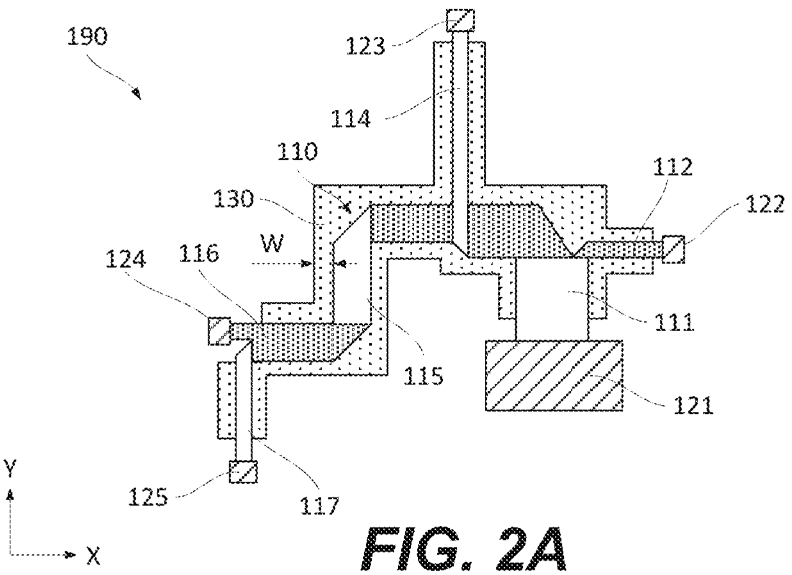
FIGS. 2A and 2B are schematic planar views of the flexible interconnect circuit in FIG. 1D in an unfolded state with a bonding film, in accordance with some examples.
Figure 2B:
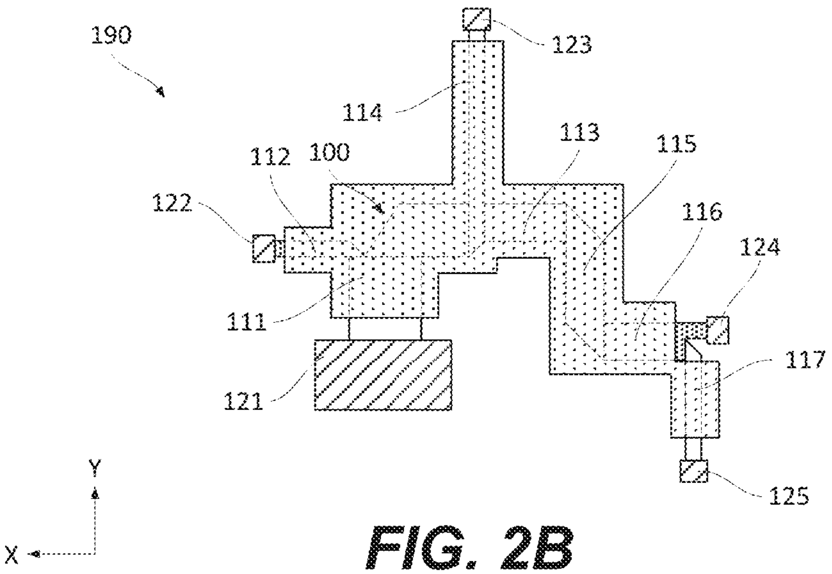

Referring to FIGS. 2A and 2B, flexible interconnect circuit assembly 190 comprises bonding film 130 attached to second side 104 of first circuit portion 111 and first side 103 of second circuit portion 112. The side, which is attached to bonding film 130, of each circuit portion depends on the folding pattern. Overall, all sides facing in one direction can be attached to bonding film 130. In some examples, all circuit portions at least partially overlap and are attached to bonding film 130. Alternatively, some circuit portions can be positioned away from bonding film 130 (not shown in FIG. 2A), e.g., extend outside the boundary of bonding film 130. Within flexible interconnect circuit assembly 190, bonding film 130 is used to support at least some circuit portions in the unfolded state, e.g., with additional support provided by temporary support film 140. Later, when flexible interconnect circuit assembly 190 is installed, bonding film 130 is used to support at least some circuit portions in the same unfolded state and attach these circuit portions to a base structure as further described below with reference to FIGS. 7A-7C.

In some examples, bonding film 130 comprises a base layer and an adhesive layer. Some examples of suitable materials for the base layer include but are not limited to polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), and/or polyvinyl butyral (PVB). In some examples, the thickness of bonding film 130 is between 10 micrometers and 200 micrometers or, more specifically, between 20 micrometers and 50 micrometers. Some examples of suitable materials for the adhesive layer include, but are not limited to, a pressure-sensitive adhesive. Bonding film 130 can be sufficiently flexible to conform to the shape of flexible interconnect circuit 100 when supporting flexible interconnect circuit 100 on temporary support film 140, e.g., as shown in FIGS. 3B and 3C, and also when supporting flexible interconnect circuit 100 on base structure 199 as, e.g., is schematically shown in FIG. 7C.

The adhesive layer faces flexible interconnect circuit 100 and bonds to circuit portions, e.g., a part of first circuit portion 111 and a part of second circuit portion 112. In some examples, another part of first circuit portion 111 (e.g., the part adjacent to first connector 121) extends outside the boundary bonding film 130. In some examples, all connectors are positioned and parts of circuit portions extending to these connectors extend outside the boundary bonding film 130. This feature provides some flexibility to the connectors when flexible interconnect circuit assembly 190 is attached to a base structure.

Bonding film 130 extends past the edges of circuit portions thereby forming adhesive flaps for connecting a base structure. In some examples, the width (W) of these adhesive flaps is between 5 millimeters and 50 millimeters or, more specifically, between 5 millimeters and 20 millimeters. Adhesive flaps can extend past one or both edges of circuit portions, e.g., as shown in FIG. 2A and FIG. 2B.

Figure 3A:
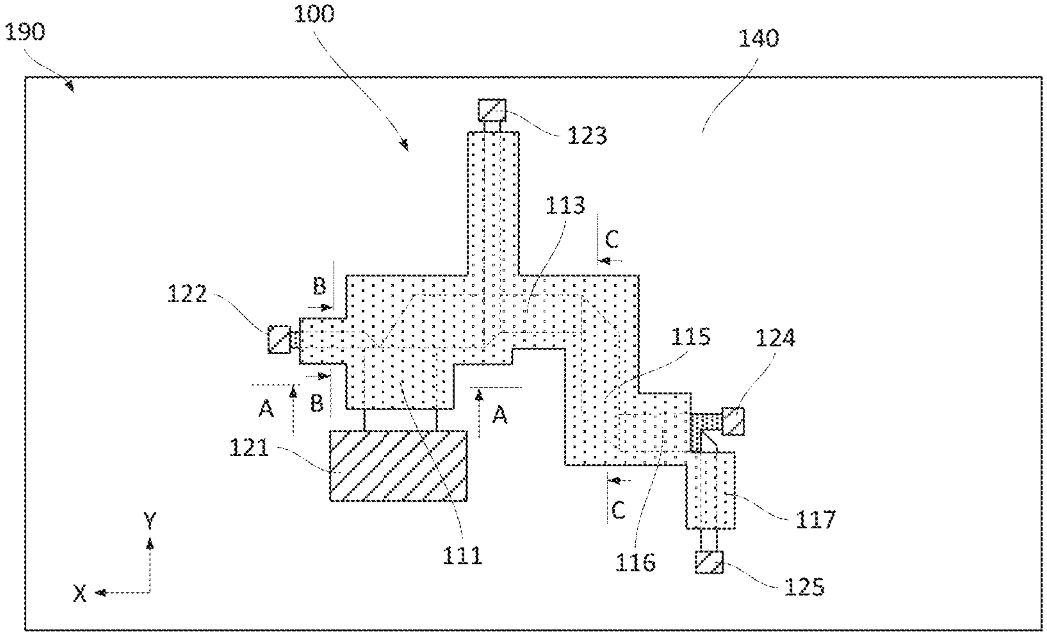
FIG. 3A is a schematic planar view of the flexible interconnect circuit in FIG. 1D in an unfolded state with a bonding film and a temporary support film, in accordance with some examples.
Figure 3B:
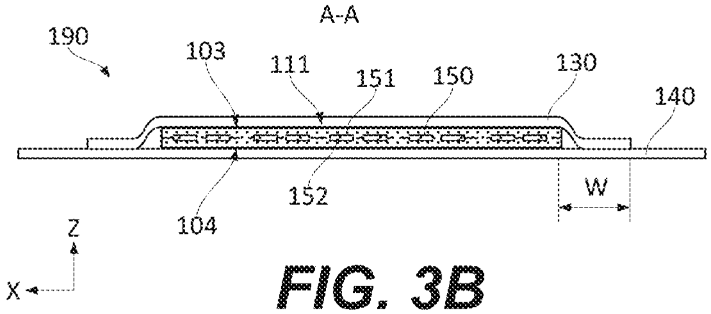
FIGS. 3B, 3C, and 3D are schematic cross-sectional views of different parts of the flexible interconnect circuit in FIG. 3A.
Figure 3C:
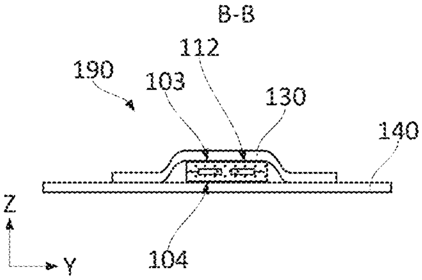

Referring to FIGS. 3A-3C, flexible interconnect circuit assembly 190 comprises temporary support film 140 attached to bonding film 130. Temporary support film 140 is used to support flexible interconnect circuit 100 prior to installation of faces interconnect circuit 100 on a base structure. During this installation, temporary support film 140 is removed and is not a part of the final assembly. Some examples of suitable materials for temporary support film 140 include but are not limited to polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), and/or polyvinyl butyral (PVB).

Figure 4A:
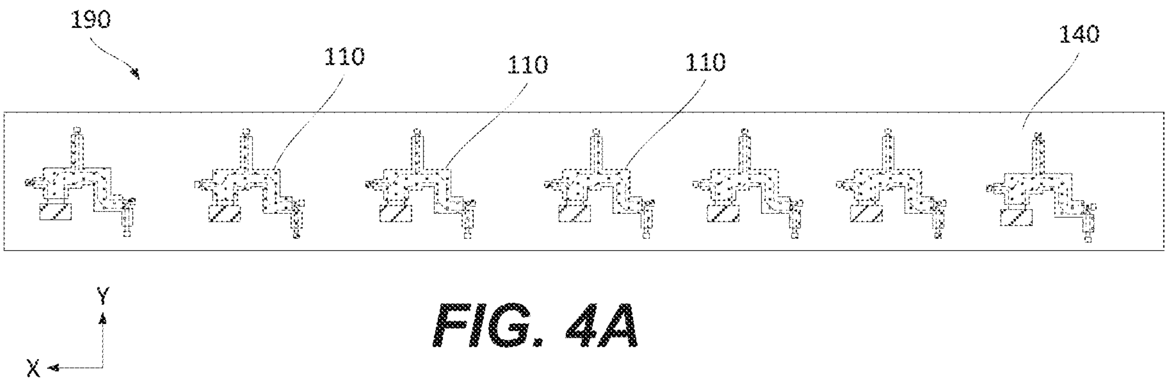
FIG. 4A is a schematic planar view of a flexible interconnect circuit assembly comprising multiple flexible interconnect circuits positioned on the same temporary support film, in accordance with some examples.
Figure 4B:
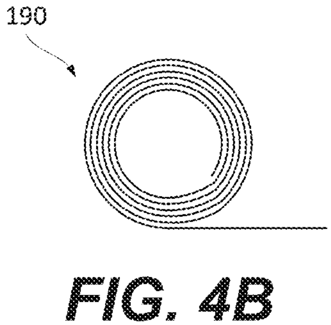
FIG. 4B is a schematic side of the flexible interconnect circuit assembly in FIG. 4A that is arranged into a roll, in accordance with some examples.

Temporary support film 140 covers the entire boundary of interconnect circuit 100 and can have a rectangular shape, e.g., to simplify handling and storage. In some examples, temporary support film 140 multiple faces interconnect circuits 100, e.g., as shown in FIG. 4A. Furthermore, flexible interconnect circuit assembly 190 can be formed into a roll, e.g., as shown in FIG. 4B. In some examples, flexible interconnect circuit assembly 190 can comprise interconnect circuits 100 having different designs.

Figure 3D:
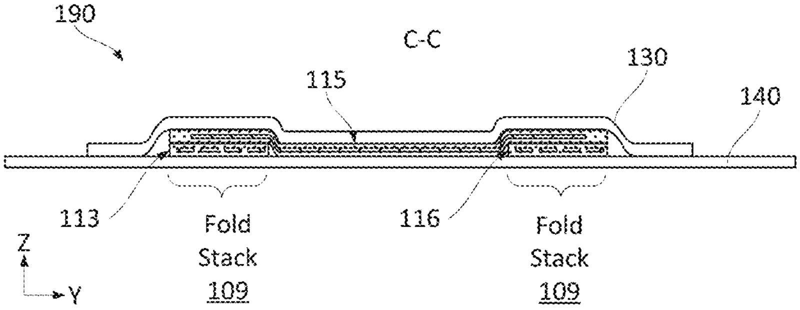

Referring to the cross-sectional view in FIGS. 3B-3D, flexible interconnect circuit 100 at least partially extends between temporary support film 140 and bonding film 130. For example, FIG. 3B illustrates first side 103 of first circuit portion 111 facing temporary support film 140. FIG. 3C illustrates second side 104 of second circuit portion 112 facing temporary support film 140. FIG. 3D illustrates fifth circuit portion 115 forming stack 109 with third circuit portion 113 and another stack 109 with sixth circuit portion 116. It should be noted that the thickness of stack 109 is twice the thickness of each circuit portion. As such, in some parts, bonding film 130 directly interfaces temporary support film 140 (e.g., away from circuit portions), spaced apart by a single circuit-portion thickness, or spaced apart by a double circuit-portion thickness. The flexibility of bonding film 130 ensures conformal coverage and minimal gaps at circuit-portion edges.

As shown in FIG. 3A, first circuit portion 111 terminates with first connector 121. First connector 121 and a part of first circuit portion 111 adjacent to first connector 121 extend outside the boundary of bonding film 130. As described above, this extension provides flexibility to first connector 121 when flexible interconnect circuit assembly 190 is installed. In more specific examples, first connector 121 and portion of first circuit portion 111 adjacent to first connector 121 overlap boundary of with temporary support film 140. In some examples, first connector 121 may be temporarily attached to temporary support film 140, e.g., to maintain the position of first connector 121 during handling of flexible interconnect circuit assembly 190 (e.g., forming a roll from flexible interconnect circuit assembly 190).

Figure 5:
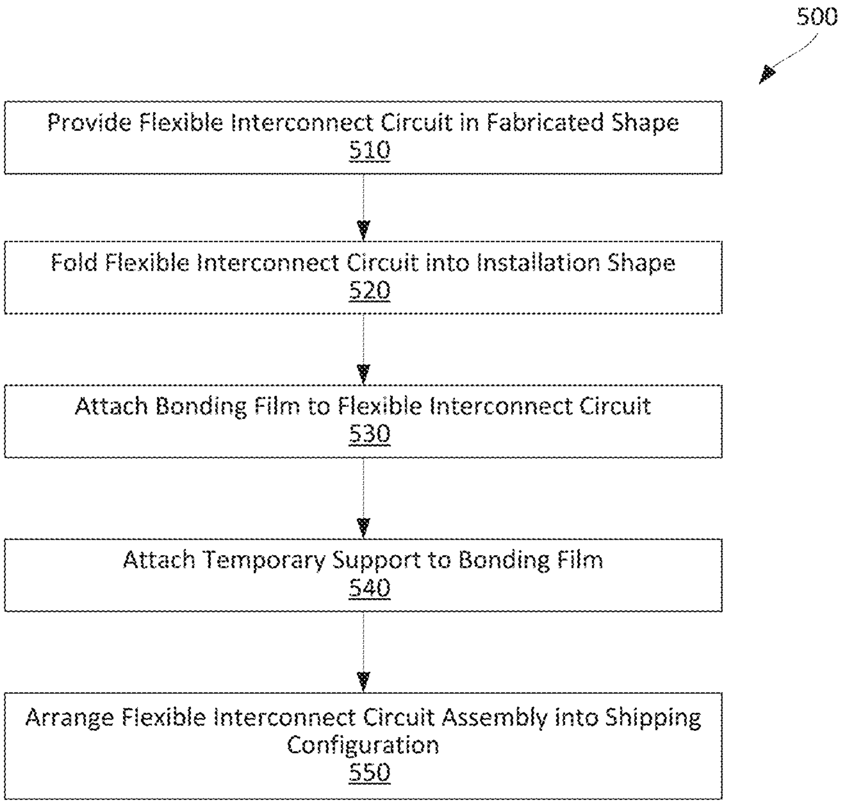
FIG. 5 is a process flowchart corresponding to a method of fabricating a flexible interconnect circuit assembly, in accordance with some examples.

FIG. 5: Examples of Forming Flexible Interconnect Circuit Assemblies

FIG. 5 is a process flowchart corresponding to method 500 of forming a flexible interconnect circuit assembly 190, in accordance with some examples. Method 500 comprises (block 510) providing flexible interconnect circuit 100 comprising first circuit portion 111 and second circuit portion 112 monolithically integrated with first circuit portion 111. Flexible interconnect circuit 100 is provided in a pre-folded state, various examples of which are described above with reference to FIGS. 1A-1C. For example, each of first circuit portion 111 and second circuit portion 112 is an elongated structure extending parallel to primary axis 108 of flexible interconnect circuit 100, e.g., as shown in FIGS. 1A and 1B. Each of first circuit portion 111 and second circuit portion 112 comprises first side 103 and second side 104, which is opposite first side 103. At this pre-folded stage, first side 103 of first circuit portion 111 and first side 103 of second circuit portion 112 face in the same direction. Similarly, second side 104 of first circuit portion 111 and second side 104 of second circuit portion 112 face in the same direction. In some examples, before folding, first circuit portion 111 and second circuit portion 112 are coplanar.

Method 500 comprises (block 520) folding second circuit portion 112 relative to first circuit portion 111 as, e.g., is schematically shown in FIG. 1D. In general, this folding of various circuit portions may be referred to as the folding of flexible interconnect circuit 100 into the installation shape. Upon completion of this operation, flexible interconnect circuit 100 is in an unfolded state/installation shape. More specifically, second circuit portion 112 is no longer parallel to primary axis 108 of flexible interconnect circuit 100. More generally, the orientation of second circuit portion 112 relative to first circuit portion 111 is changed during this operation. Furthermore, first side 103 of first circuit portion 111 and first side 103 of second circuit portion 112 face in opposite directions after folding as, e.g., is schematically shown in FIG. 1E. It should be noted that other circuit portions can be folded in the same operation, e.g., as schematically shown in FIG. 1D.

In some examples, after folding, a part of first side 103 of first circuit portion 111 directly interfaces a part of first side 103 of second circuit portion 112, e.g., as shown in FIG. 1E. Alternatively, a part of second side 104 of first circuit portion 111 can directly interface a part of second side 104 of second circuit portion 112 (e.g., if second circuit portion 112 is folded in a different direction relative to first circuit portion 111). In some examples, these interfacing parts are glued to each other, e.g., to preserve the fold.

Method 500 comprises (block 530) attaching bonding film 130 to second side 104 of first circuit portion 111 and first side 103 of second circuit portion 112 as, e.g., is schematically shown in FIGS. 2A and 2B. For example, bonding film 130 can be laminated to flexible interconnect circuit 100. In some examples, bonding film 130 is initially attached as a larger component, which is later cut based on the folded shape of flexible interconnect circuit 100. It should be that when bonding film 130 is attached to flexible interconnect circuit 100, portions of flexible interconnect circuit 100 can extend past the boundaries of bonding film 130. Furthermore, it should be noted portions of bonding film 130 extend past the boundaries of flexible interconnect circuit 100 thereby creating adhesive flaps.

Method 500 comprises (block 540) attaching temporary support film 140 to bonding film 130 such that first side 103 of first circuit portion 111 and second side 104 of second circuit portion 112 faces temporary support film 140 as, e.g., is schematically shown in FIGS. 3A-3D. As such a portion of flexible interconnect circuit 100 is positioned between temporary support film 140 and bonding film 130. Furthermore, all adhesive flaps of bonding film 130 can be covered by temporary support film 140 after this operation thereby not leaving any exposed adhesive surfaces. When temporary support film 140 is removed from flexible interconnect circuit assembly 190 at later operations, these adhesive flaps are exposed again for bonding to various panels, e.g., as further described below with reference to FIG. 6.

In some examples, method 500 comprises (block 550) arranging flexible interconnect circuit assembly 190 into a shipping configuration selected from the group consisting of a planar sheet and a roll. In some examples, flexible interconnect circuit assembly (e.g., formed into a roll) comprises additional flexible interconnect circuits.

Figure 6:
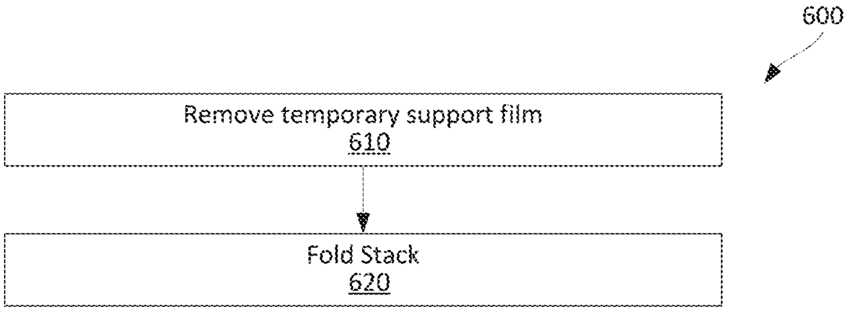
FIG. 6 is a process flowchart corresponding to a method of installing a flexible interconnect circuit assembly on a base structure, in accordance with some examples.
Figure 7A:
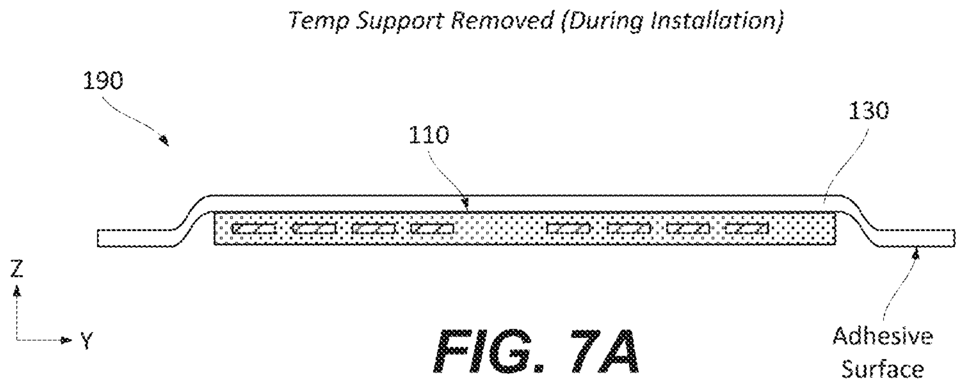
FIGS. 7A, 7B, and 7C are schematic views of a flexible interconnect circuit during the installation of this assembly on a base structure, in accordance with some examples.
Figure 7B:
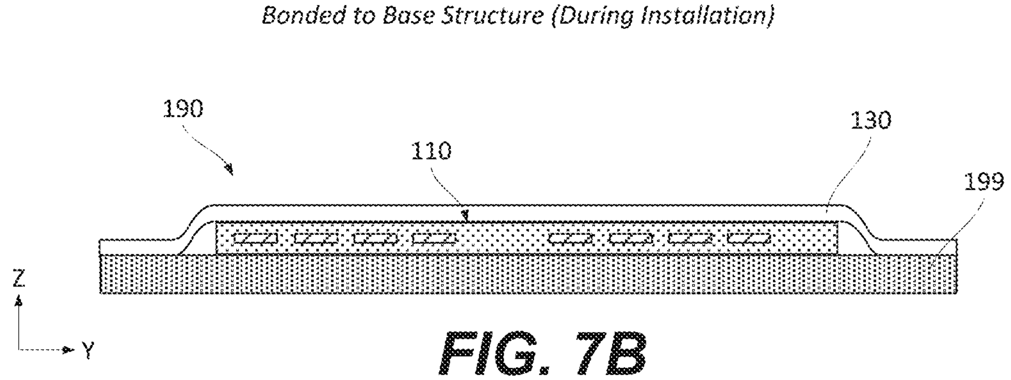
Figure 7C:
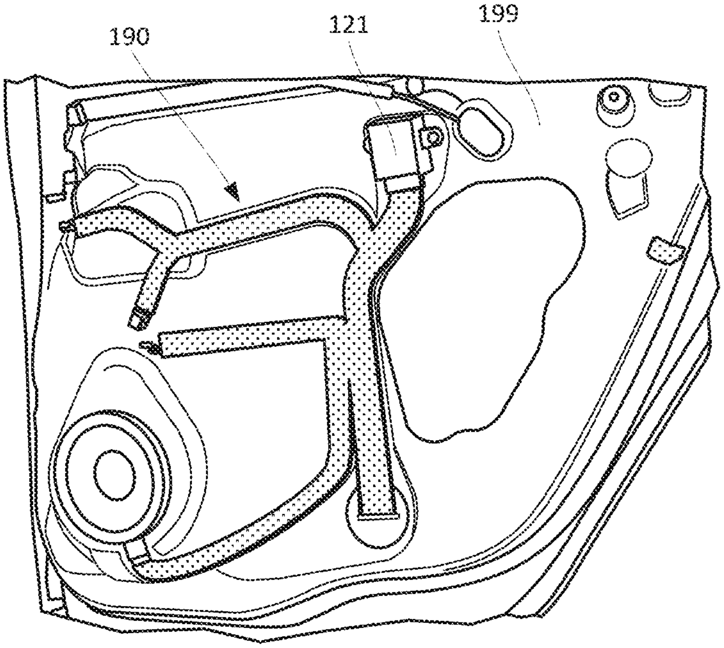

FIGS. 6 and 7A-7C: Examples of Installing Flexible Interconnect Circuit Assemblies FIG. 6 is a process flowchart corresponding to method 600 of installing flexible interconnect circuit assembly 190 onto base structure 199, in accordance with some examples. FIGS. 7A-7C are schematic illustrations of different stages during method 600. Various examples of base structure 199 are within the scope, such as a car panel (e.g., a door panel) as shown in FIG. 7C.

Method 600 may commence with (block 610) removing temporary support film 140, thereby exposing parts of the adhesive surface of bonding film 130, e.g., as shown in FIG. 7A. These exposed adhesive surfaces can be referred to as adhesive flaps and are used for adhering flexible interconnect circuit assembly 190 onto base structure 199. For example, bonding film 130 can comprise a pressure-sensitive adhesive surface. Furthermore, it would be noted that temporary support film 140, once removed in this operation, can be reused in the process described in FIG. 5.

Method 600 proceeds with (block 620) pressing this adhesive surface against base structure 199 thereby attaching flexible interconnect circuit assembly 190 to base structure 199, e.g., as shown in FIG. 7B. A part of flexible interconnect circuit 100 is positioned between bonding film 130 and base structure 199 and is supported by bonding film 130 relative to base structure 199. In some examples, flexible interconnect circuit assembly 190 comprises various aligning features (e.g., marks/cuts on bonding film 130 and/or flexible interconnect circuit 100 to determine the position of flexible interconnect circuit assembly 190 relative to base structure 199.

FIGS. 8A-8C, 9A-9C, 10A-10F, and 11: Examples of Folded Flexible Interconnect Circuits Referring to FIG. 8A-8C, in some examples, flexible interconnect circuit 100 comprises first insulating layer 151, second insulating layer 152, and conductive traces 150. Conductive traces 150 are positioned between first insulating layer 151 and second insulating layer 152 such that first insulating layer 151 and second insulating layer 152 are bonded together around conductive traces 150. Various examples of first insulating layer 151, second insulating layer 152, and conductive traces 150 are described above.

Figure 8A:
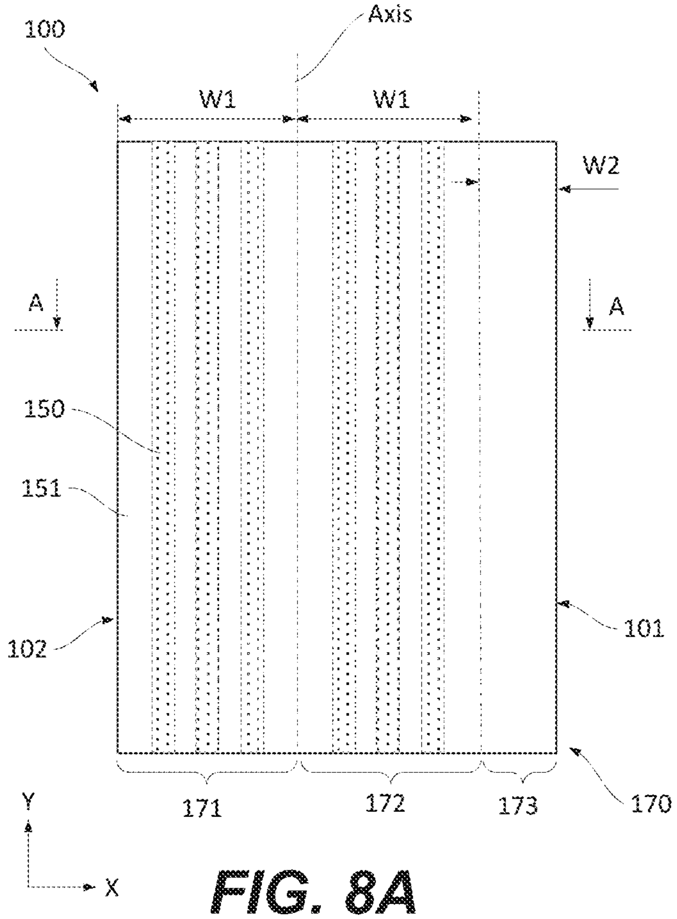
FIG. 8A is a schematic planar view of a flexible interconnect circuit, comprising a flap portion, in a pre-folded state, in accordance with some examples.
Figure 8B:
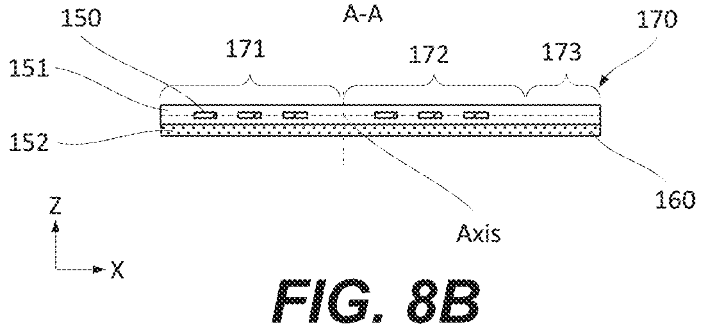
FIG. 8B is a schematic cross-sectional view of the flexible interconnect circuit in FIG. 8A, in a pre-folded state.
Figure 8C:
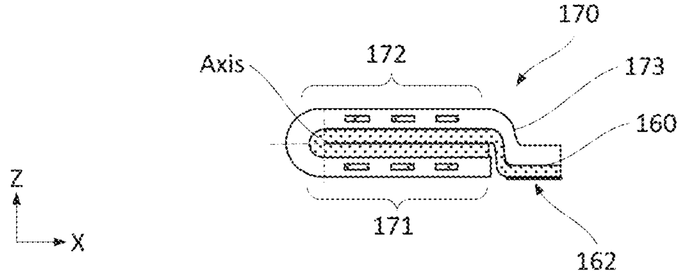
FIG. 8C is a schematic cross-sectional view of the flexible interconnect circuit in FIG. 8A, in a folded state.

Flexible interconnect circuit 100 also comprises adhesive layer 160, interfacing and covering second insulating layer 152 such that second insulating layer 152 is positioned between first insulating layer 151. First insulating layer 151, second insulating layer 152, and adhesive layer 160 form stack 170 comprising first stack portion 171, second stack portion 172, and flap portion 173. FIGS. 8A and 8B illustrate flexible interconnect circuit 100 in a pre-folded state. In this state, first stack portion 171, second stack portion 172, and flap portion 173 are coplanar. FIG. 8C illustrates flexible interconnect circuit 100 in a folded state. In this state, first stack portion 171 and second stack portion 172 overlap with each other, effectively forming a secondary stack. It should be noted that in this state, flap portion 173 does not overlap with either first stack portion 171 or second stack portion 172. Instead, flap portion 173 extends away from the secondary stack (formed by first stack portion 171 and second stack portion 172) and is available for bonding to other structures.

Referring to FIG. 8C, adhesive layer 160 in first stack portion 171 interfacing and adhered to adhesive layer 160 in second stack portion 172. This adhesive-adhesive interface preserves the shape of the secondary stack (formed by first stack portion 171 and second stack portion 172). Furthermore, adhesive layer 1360 in flap portion 173 extends past first stack portion 171 and second stack portion 172. This adhesive layer 160 in flap portion 173 is available for bonding to external structures.

Referring to FIG. 8C, in some examples, adhesive layer 160 of flap portion 173 is covered by temporary liner 162. Temporary liner 162 allows handling and transporting flexible interconnect circuit 100 and preserving the surface of adhesive layer 160. When flexible interconnect circuit 100 is installed, temporary liner 162 is removed, and adhesive layer 160 of flap portion 173 is exposed.

In some examples, flap portion 173 is free from conductive traces 150. This feature improves the flexibility of flap portion 173. Furthermore, the flexibility of flap portion 173 can be further improved by extending only one of first insulating layer 151 and second insulating layer 152 into flap portion 173. Furthermore, flap portion 173 can have neither first insulating layer 151 and second insulating layer 152. Instead, adhesive layer 160 comprises its own base layer (e.g., attached to first insulating layer 151 and second insulating layer 152), on which the adhesive is deposited. Alternatively, flap portion 173 comprises both first insulating layer 151 and second insulating layer 152. In more specific examples, flap portion 173 also comprises one or more conductive traces 150 (not shown in FIG. 8C). In some examples, the flexibility of flap portion 173 is increased by providing various cut features at the interface of flap portion 173 and stack 170 and/or within flap portion 173. In some examples, the width of flap portion 173 (in the X direction in FIG. 8C) is between 5 millimeters and 70 millimeters or, more specifically, between 10 millimeters and 50 millimeters.

Figure 9A:
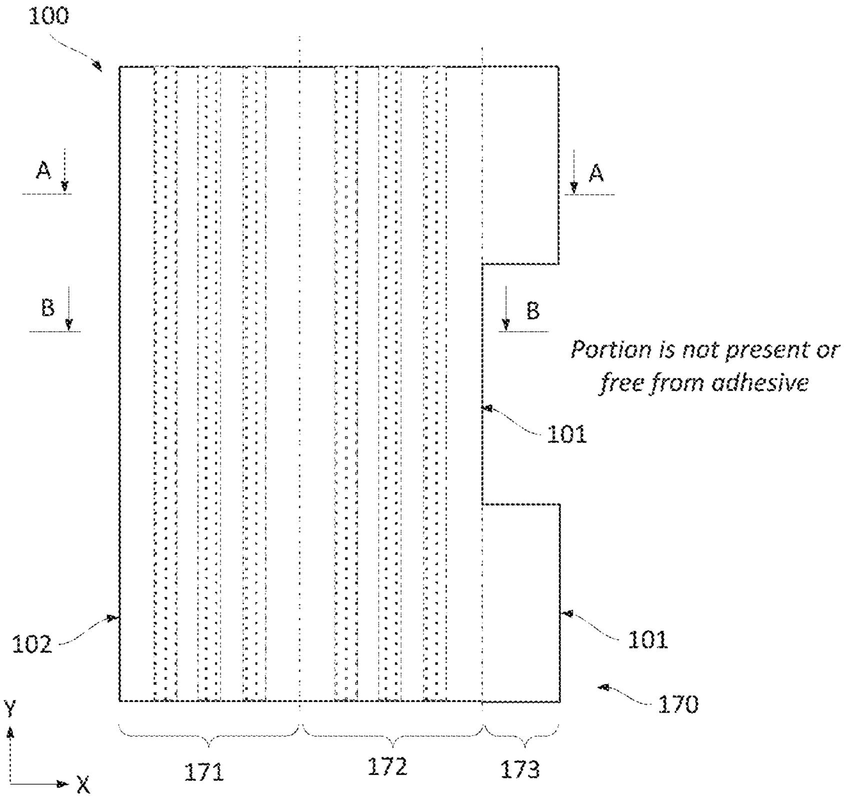
FIG. 9A is a schematic planar view of a flexible interconnect circuit, comprising a segmented flap portion, in a pre-folded state, in accordance with some examples.
Figure 9B:
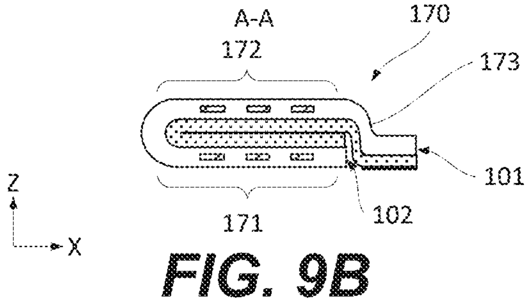
FIGS. 9B and 9C are schematic cross-sectional views of the flexible interconnect circuit in FIG. 9A at different locations.
Figure 9C:
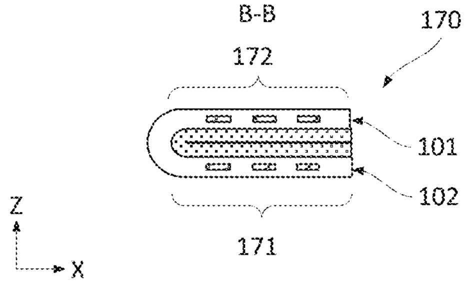

While FIG. 8A illustrates flap portion 173 being a continuous structure forming the entire first edge 101 of flexible interconnect circuit 100, other examples are also within the scope. For example, FIG. 9A illustrates an example of flexible interconnect circuit 100 wherein flap portions 173 are discontinuous patches. The "A-A" cross-section (shown in FIG. 9B) represents the part of flexible interconnect circuit 100 where flap portion 173 is present. The "B-B" cross-section (shown in FIG. 9C) represents the part of flexible interconnect circuit 100 where flap portion 173 is not present. This flap "cutout" can be used to clear various features on the base structure during the installation of flexible interconnect circuit 100 onto this base structure.

Figure 10A:
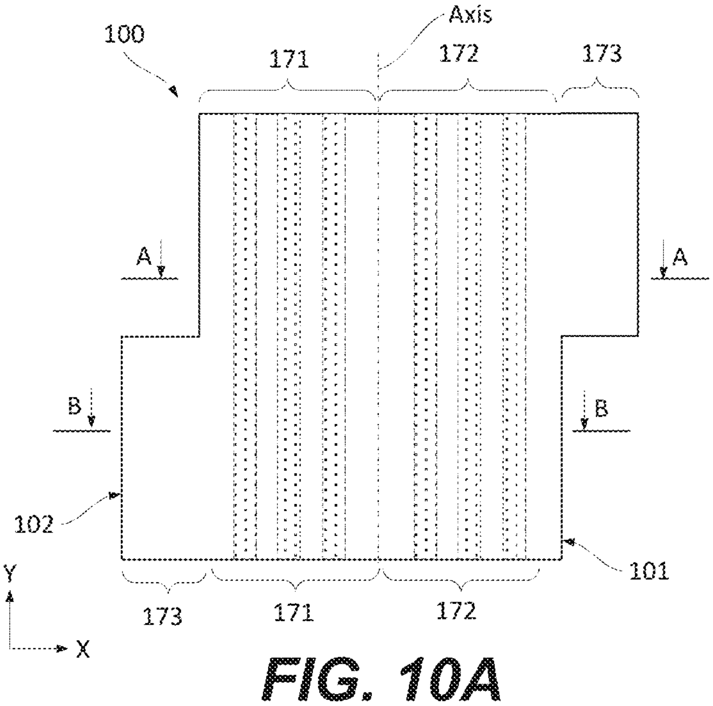
FIG. 10A is a schematic planar view of a flexible interconnect circuit, comprising flap portions on different sides of the circuit, in a pre-folded state, in accordance with some examples.
Figure 10B:
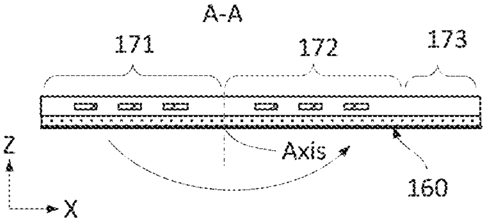
FIGS. 10B and 10C are schematic cross-sectional views of one portion of the flexible interconnect circuit in FIG. 10A in pre-folder and folded states.
Figure 10D:
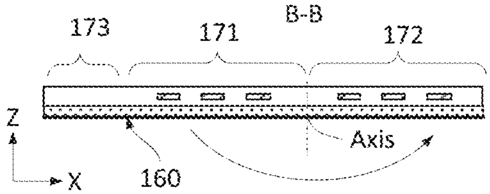
FIGS. 10D and 10E are schematic cross-sectional views of another portion of the flexible interconnect circuit in FIG. 10A in pre-folder and folded states.
Figure 10C:
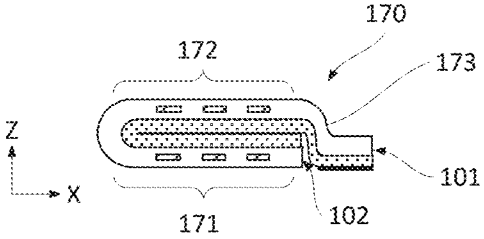
Figure 10E:
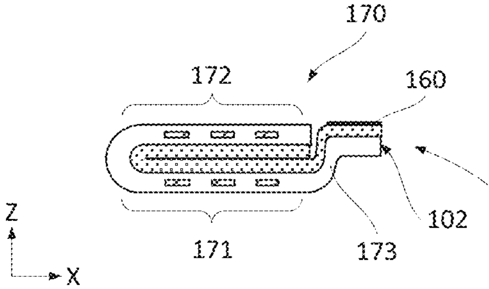
Figure 10F:
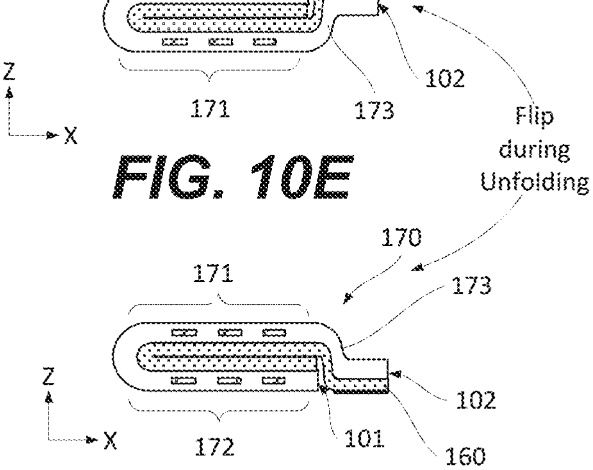
FIG. 10F is a schematic cross-sectional view of the portion of the flexible interconnect circuit shown in FIG. 10F after flipping that portion.
Figure 11:
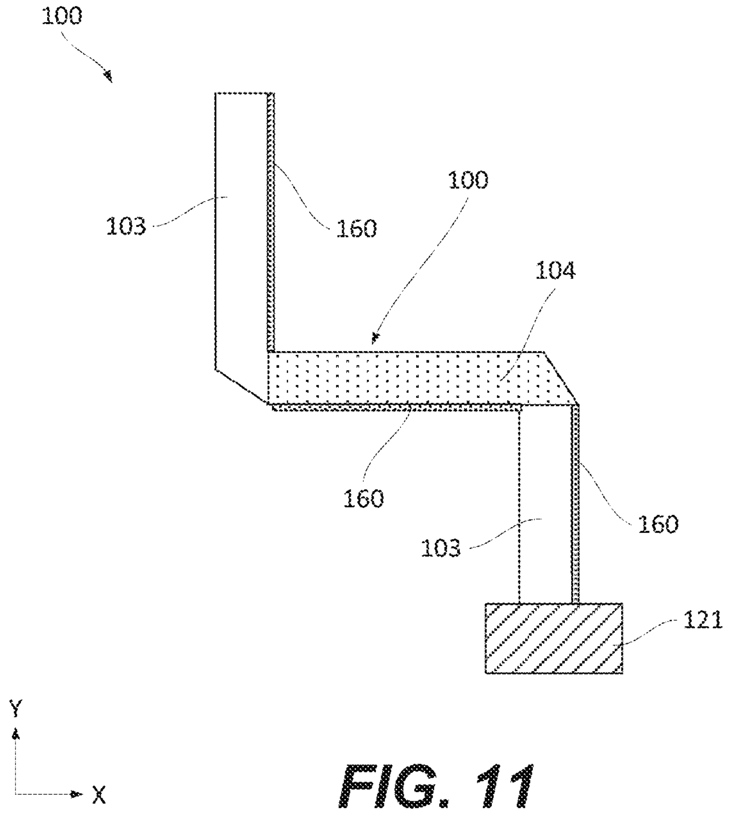
FIG. 11 is a schematic planar view of the flexible interconnect circuit in FIG. 10A in an unfolded state, in accordance with some examples.

Furthermore, flap portions 173 can form different (opposite) edges of flexible interconnect circuit 100, e.g., as schematically shown in FIGS. 10A-10F. This approach allows positioning adhesive layer 160 on different sides of flexible interconnect circuit 100 during the initial folding of flexible interconnect circuit 100 (in the initial folded stage that is schematically shown in FIGS. 10C and 10E). When flexible interconnect circuit 100 is later unfolded (e.g., by further folding a circuit portion as described above with references to FIGS. 1A-1E and schematically shown by FIGS. 10E and 10F herein), adhesive layer 160 is positioned on the same side (e.g., shown in FIGS. 10C and 10F). This unfolding of flexible interconnect circuit 100 is also schematically shown in FIG. 11 with the position of adhesive layer 160 identified. Alternatively, adhesive layer 160 can remain positioned on different sides, e.g., for installation on complex objects/surfaces.

Figure 12:
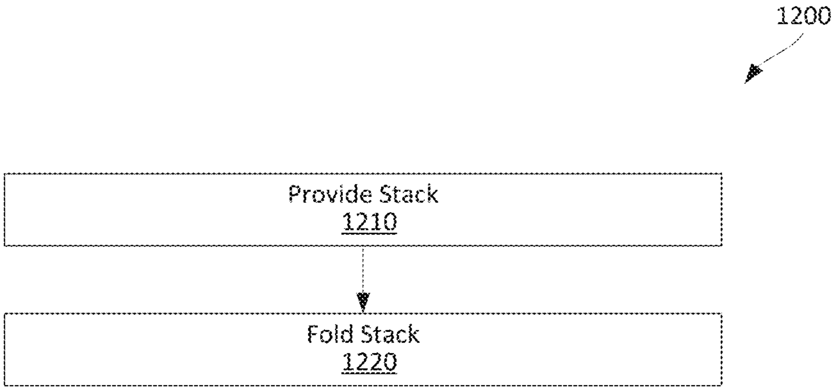
FIG. 12 is a process flowchart corresponding to a method of fabricating a flexible interconnect circuit assembly, in accordance with some examples

FIG. 12: Examples of Forming Folded Flexible Interconnect Circuits

FIG. 12 is a process flowchart corresponding to method 1200 forming flexible interconnect circuit 100, in accordance with some examples. Various examples of flexible interconnect circuit 100 are described above with reference to FIGS. 9A-11.

In some examples, method 1200 comprises (block 1210) providing stack 170 formed by first insulating layer 151, second insulating layer 152, conductive traces 150, and adhesive layer 1360. As described above and shown with reference to FIGS. 8A and 8B, conductive traces 150 are positioned between first insulating layer 151 and second insulating layer 152 such that first insulating layer 151 and second insulating layer 152 are bonded together around conductive traces 150. Adhesive layer 160 interfaces and covers second insulating layer 152 such that second insulating layer 152 is positioned between first insulating layer 151. Stack 170 comprises first stack portion 171, second stack portion 172, and flap portion 173. At this stage, stack 170 is in a pre-folded state as, e.g., is schematically shown in FIGS. 8A and 8B. In this state, first stack portion 171, second stack portion 172, and flap portion 173 can be coplanar.

In some examples, method 1200 comprises (block 1220) folding stack 170 such that first stack portion 171 and second stack portion 172 overlap and adhesive layer 160 in first stack portion 171 interfacing and adhered to adhesive layer 160 in second stack portion 172 as, e.g., is schematically shown in FIG. 8C. Adhesive layer 160 in flap portion 173 extends past first stack portion 171 and second stack portion 172.

FIG. 13A-14B: Examples of Connector-Support Portions

Figure 13A:
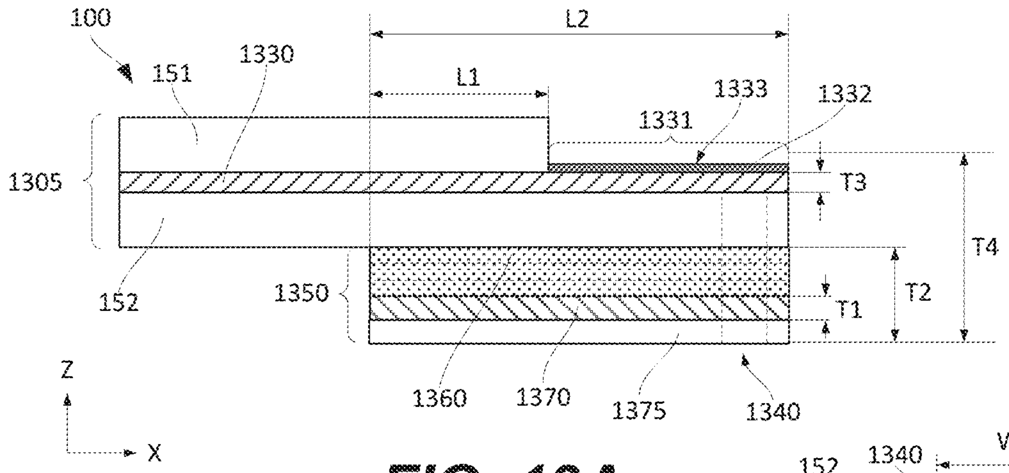
FIG. 13A is a cross-sectional side view of a flexible interconnect circuit comprising a connector-support portion with a reinforcement metal layer, in accordance with some examples.

FIG. 13A is a cross-sectional side view of flexible interconnect circuit 100 comprising connector-support portion 1350, in accordance with some examples. A portion of flexible interconnect circuit 100 without connector-support portion 1350 can be referred to as primary portion 1305. Connector-support portion 1350 is attached to primary portion 1305 of flexible interconnect circuit 100, e.g., at each end of primary portion 1305 that receives a connector.

Connector-support portion 1350 provides additional mechanical support to this end of primary portion 1305 when the connector is attached to the end as further described below with reference to FIGS. 14A and 14B.

Figure 13B:
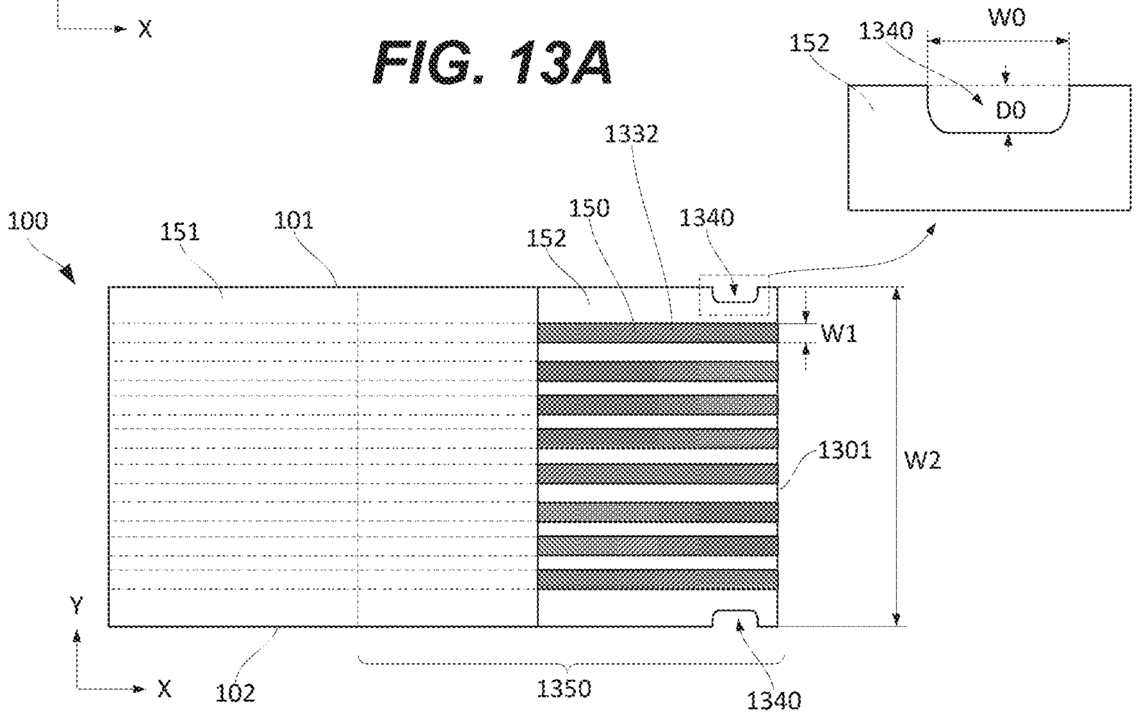
FIG. 13B is a top view of the flexible interconnect circuit in FIG. 13A that shows \conductive leads (of an exposed portion) and notches for engaging a connector, in accordance with some examples.
Figure 13C:
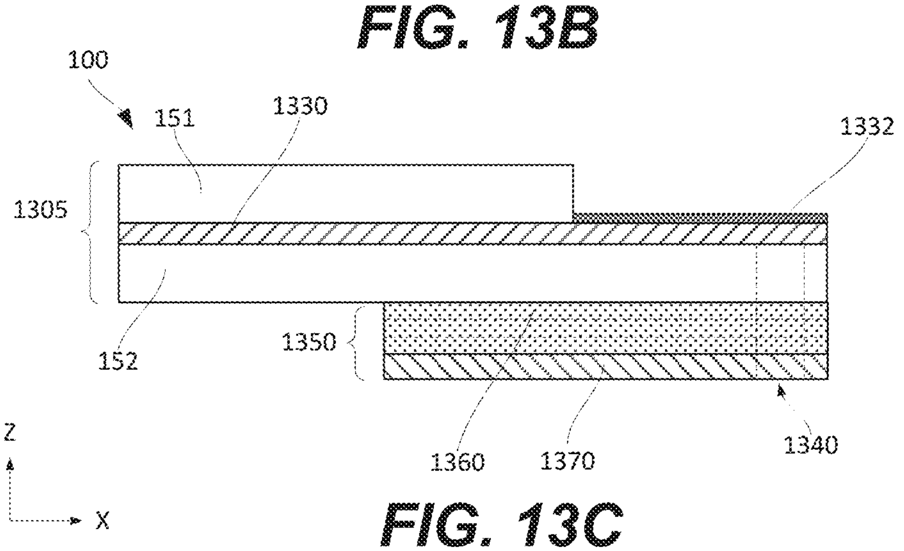
FIG. 13C is a cross-sectional side view of another example of a flexible interconnect circuit comprising a connector-support portion with an exposed reinforcement metal layer, in accordance with some examples.

Flexible interconnect circuit 100 or, more specifically, primary portion 1305 comprises first insulating layer 151, second insulating layer 152, and conductive layer 1330. Conductive layer 1330 is partially positioned between first insulating layer 151 and second insulating layer 152 (e.g., away from the ends of primary portion 1305). Conductive layer 1330 comprises one or more conductive traces 150, which may be also referred to as conductive leads. For example, FIG. 13B illustrates eight conductive traces 150. However, any number of conductive traces 150 are within the scope. In some examples, the number of conductive traces 150 extending to a particular end of primary portion 1305 depends on the number of conductive elements in the connector attached to this end. In a flexible interconnect assembly, conductive traces 150 form individual electrical connections to corresponding conductive elements of the connector attached to this end.

The thickness of one or both first insulating layer 151 and second insulating layer 152 may be between 1 micrometer and 500 micrometers or, more specifically, between 10 micrometers and 125 micrometers. In some examples, each of first insulating layer 151 and second insulating layer 152 includes an adhesive sublayer facing conductive layer 1330, e.g., for lamination to conductive layer 1330 and also to each other. These adhesive sublayers may be also used for directly laminating first insulating layer 151 and second insulating layer 152 (beyond the conductive layer boundaries), e.g., for edge sealing of flexible interconnect circuit 100. In some examples, the surface of first insulating layer 151 and/or second insulating layer 152 (e.g., the surface facing away from conductive layer 1330) comprises an adhesive sublayer for bonding this insulating layer to an external structure (e.g., a supporting panel). First insulating layer 151 and second insulating layer 152 provide the electrical isolation and mechanical support to conductive layer 1330. Additional aspects (e.g., materials) of first insulating layer 151 and second insulating layer 152 are described elsewhere in this document. Furthermore, additional aspects of conductive traces 150 or, more generally, conductive layer 1330 formed by these traces are described elsewhere in this document (e.g., uniform thickness, materials, surface sublayers).

One or more conductive traces 150 comprises exposed portion 1331 extending past at least first insulating layer 151 as, e.g., is schematically shown in FIGS. 1A and 1B. Exposed portion 1331 of conductive traces 150 allows forming of electrical connections between these conductive traces 150 and the corresponding conductive elements of the connector. In some examples, exposed portion 1331 is between 0.5 millimeters and 5 millimeters long (in the X-direction) or, more specifically, between 1 millimeter and 3 millimeters long.

In some examples, exposed portion 1331 comprises contact interface layer 1332 forming exposed surface 1333 (which directly interfaces with conductive elements of the connector). For example, contact interface layer 1332 is formed with electroless nickel immersion gold (ENIG). Specifically, contact interface layer 1332 can be formed over a base layer of conductive traces 150, with the base layer formed from copper, aluminum, and the like. Contact interface layer 1332 is used to reduce the oxidation and improve the solderability of the base layer. Contact interface layer 1332 can be formed by electroless nickel plating of the base layer followed by immersion in a solution comprising a gold-containing salt. During this immersion process, a portion of nickel is oxidized, while the gold ions are reduced to a metallic state and deposited on the surface. In some examples, palladium is used in addition to or instead of gold.

Referring to FIG. 13A, in some examples, connector-support portion 1350 comprises reinforcement metal layer 1370 and is attached to second insulating layer 152. Various forms of attachments are within the scope. For example, connector-support portion 1350 can comprise adhesive layer 1360, interfacing with second insulating layer 152. More specifically, adhesive layer 1360 is positioned between reinforcement metal layer 1370 and second insulating layer 152 thereby attaching connector-support portion 1350 to second insulating layer 152. For example, adhesive layer 1360 comprises a pressure-sensitive adhesive. In the same or another example, adhesive layer 1360 comprises double-sided adhesive tape. The thickness of adhesive layer 1360 can be between 20 micrometers and 250 micrometers or, more specifically, between 50 micrometers and 200 micrometers.

As noted above, connector-support portion 1350 comprises reinforcement metal layer 1370. Reinforcement metal layer 1370 provides mechanical reinforcement to flexible interconnect circuit 100 when flexible interconnect circuit 100 is attached to a connector as further described below with reference to FIGS. 14A and 14B. For example, reinforcement metal layer 1370 can engage the connector helping to improve the pull-out strength of the attachment between flexible interconnect circuit 100 and the connector. Reinforcement metal layer 1370 can be in the form of a metal plate or foil. In some examples, reinforcement metal layer 1370 comprises one or more of aluminum (e.g., hardened aluminum such as 1350-H19) and stainless steel. The thickness (T1) of reinforcement metal layer 1370 can be between 20 micrometers and 200 micrometers or, more specifically, between 40 micrometers and 150 micrometers or even between 50 micrometers and 100 micrometers. A combination of these features of reinforcement metal layer 1370 helped to significantly improve (e.g., by 20%) the connector retention force in comparison to conventional flexible circuits (i.e., the force along the X-axis).

Referring to FIG. 13A, connector-support portion 1350 at least partially overlaps with exposed portion 1331. More specifically, connector-support portion 1350 can fully overlap with exposed portion 1331. For purposes of this disclosure, the term "overlap" means the corresponding alignment of X-Y footprints of different components, e.g., comparing the Z-axis projections of different components. These overlaps ensure the support of exposed portion 1331 relative to the rest of flexible interconnect circuit 100 and also the support of exposed portion 1331 relative to the connector to which this exposed portion 1331 is attached. Specifically, exposed portion 1331 is inserted into a connector to form electrical connections between conductive traces 150 and conductive elements of the connector as further described below with reference to FIGS. 2A and 2B. As such, connector-support portion 1350 is also partially inserted into the connector. Connector-support portion 1350 mechanically engages the connector. In some examples, the length (L2) of connector-support portion 1350 (in the X-direction) is between 5 millimeters and 30 millimeters or, more specifically, between 10 millimeters and 20 millimeters.

In some examples, connector-support portion 1350 at least partially overlaps with first insulating layer 151. The length (L1) of this overlap portion can be between 3 millimeters and 25 millimeters or, more specifically, between 5 millimeters and 17 millimeters. Furthermore, the entire connector-support portion 1350 can overlap with second insulating layer 152 as, e.g., is schematically shown in FIG. 1A.

In some examples, connector-support portion 1350 further comprises protective layer 1375 such that reinforcement metal layer 1370 is positioned between protective layer 1375 and second insulating layer 152. Protective layer 1375 isolates reinforcement metal layer 1370 from the environment, e.g., when forming contact interface layer 1332. Protective layer 1375 can comprise one or more polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), and/or polyvinyl butyral (PVB). The thickness of protective layer 1375 can be between 5 micrometers and 100 micrometers or, more specifically, between 10 micrometers and 50 micrometers. It should be noted that protective layer 1375 is optional. In some examples, e.g., shown in FIG. 13C, connector-support portion 1350 does not have a protective layer. In these examples, reinforcement metal layer 1370 is exposed. Furthermore, in these examples, contact interface layer 1332 can be formed before attaching connector-support portion 1350 to primary portion 1305 of flexible interconnect circuit 100.

Referring to FIG. 13B, in some examples, flexible interconnect circuit 100 comprises notches 1340 used for engaging a connector as further described below with reference to FIGS. 14A and 14B. For example, notches 1340 can be positioned on side edges (e.g., first edge 101 and second edge 102) of flexible interconnect circuit 100. For purposes of this disclosure, the side edges are defined as edges that extend to the end of flexible interconnect circuit 100, which is inserted into a connector. Leading edge 1301 extends between the two side edges and is defined as an edge that is inserted into the connector. Notches 1340 extend at least through reinforcement metal layer 1370 of connector-support portion 1350. In some examples, notches 1340 extend through all components (layers) of connector-support portion 1350. Furthermore, notches 1340 can extend through one or more components of primary portion 1305, e.g., second insulating layer 152.

Figure 14A:
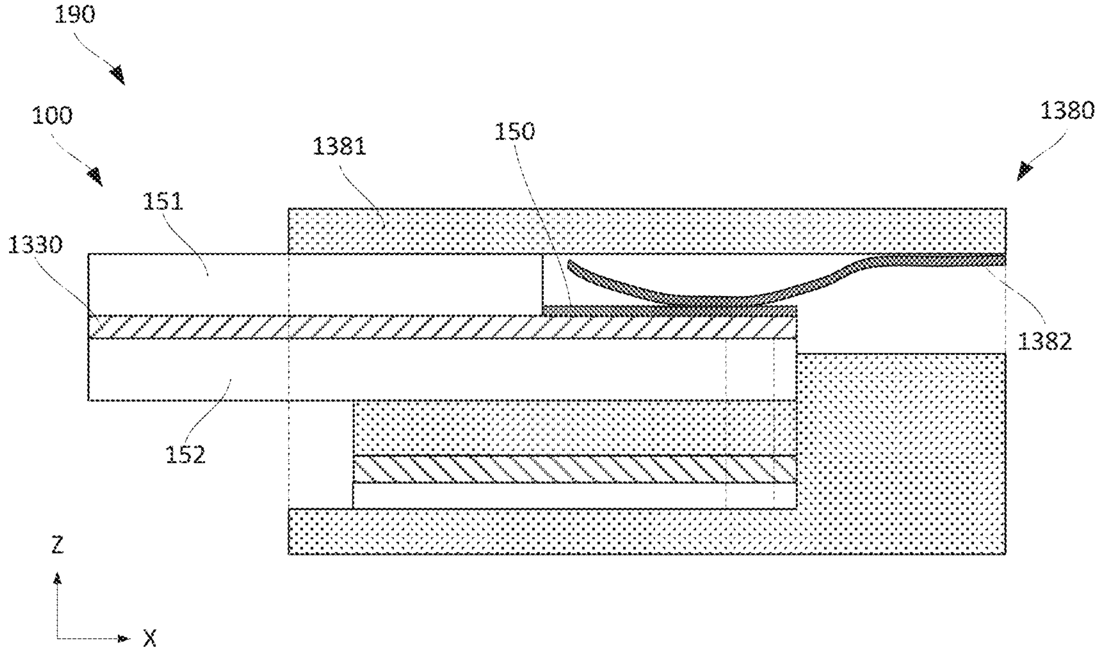
FIG. 14A is a cross-sectional side view of a flexible interconnect assembly, utilizing the flexible interconnect circuit in FIG. 13A, that comprises a connector.
Figure 14B:
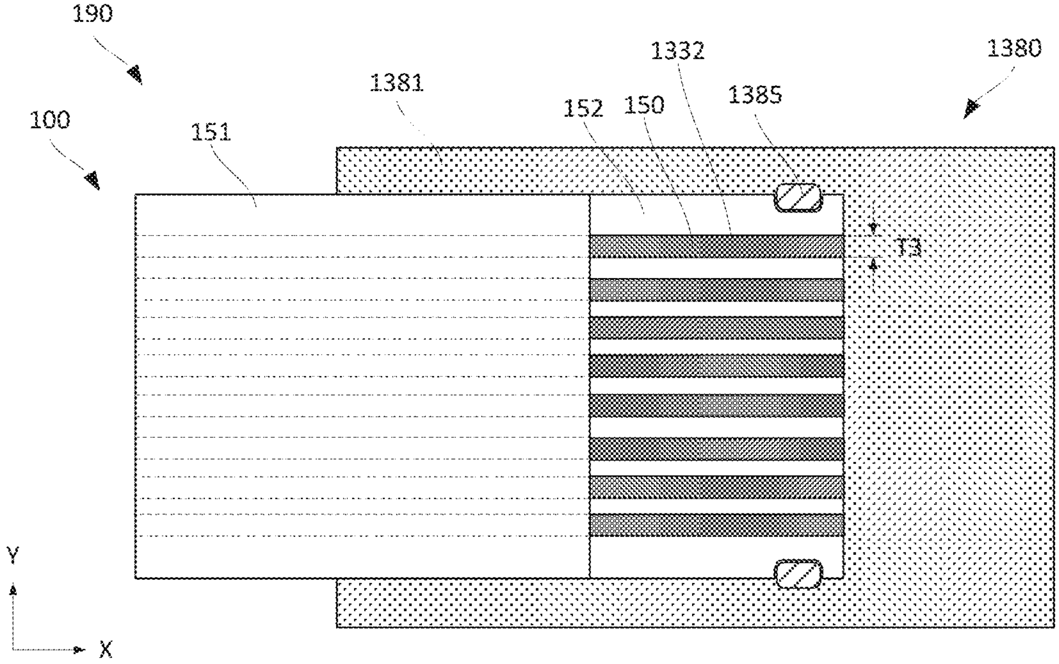
FIG. 14B is a top cross-sectional view of the flexible interconnect assembly in FIG. 14A, showing the retention pins of the connector extending into the notches of the flexible interconnect circuit, in accordance with some examples.

As noted above, notches 1340 are used for engaging a connector or, more specifically, retention pins 1385 of connector 1380, e.g., as schematically shown in FIG. 14B. As such, the size of notches 1340 and relative positions (e.g., relative to leading edge 1301) are determined by the connector specifications. Referring to FIG. 13B, in some examples, the depth (D0) of notches 1340 is between about 0.2 millimeters and 1.5 millimeters or, more specifically, between 0.4 millimeters and 0.8 millimeters. The width (W0) of notches is between about 1 millimeter and 5 millimeters or, more specifically, between 2 millimeters and 4 millimeters. In some examples, the width (W2) of the leading edge, which is inserted into a connector, is between 5 millimeters and 50 millimeters or, more specifically, between 7 millimeters and 20 millimeters. The width of the leading edge may depend on the number of conductive traces 150, expecting this edge. For example, FIG. 13B illustrates eight conductive traces 150 extending to the leading edge. However, any number is within the scope, e.g., one, two, three, four, and so on. In some examples, the number can be 6, 8, 10, 20, 25, 30, 35, 40, 45, 50, 55, and 60.

FIG. 14A is a cross-sectional side view of flexible interconnect assembly 190 utilizing flexible interconnect circuit 100, various examples of which are described above with reference to FIGS. 1A-1C. FIG. 14B is a top cross-sectional view of the flexible interconnect assembly in FIG. 14A shows additional features of flexible interconnect assembly 190. Specifically, flexible interconnect assembly 190 comprises connector 1380 in addition to flexible interconnect circuit 100. Connector 1380 comprises housing 1381 and one or more conductive elements 1382. Housing 1381 mechanically engages reinforcement metal layer 1370 of connector-support portion 1350. Each of one or more conductive elements 1382 directly interfaces and is electrically coupled to a corresponding one of one or more conductive traces 150. One example of connector 1380 is a zero insertion force (ZIF) connector. For example, before the insertion of interconnect circuit 100 into connector 1380, a lever or slider (provided in housing 1381) is moved into an unlocked position, pushing all the sprung conductive elements 1382 away so that interconnect circuit 100 can be inserted with minimal force. The lever or slider is then moved into a locked position, allowing the conductive elements 1382 to close and interface with conductive traces 150 of interconnect circuit 100. In some examples, flexible interconnect circuit 100 comprises notches 1340, each positioned on side edge 102 of flexible interconnect circuit 100 and extending at least through reinforcement metal layer 1370 of connector-support portion 1350. Connector 1380 comprises retention pins 1385, such that each of retention pins 1385 extends into a corresponding one of notches 1340.

FIGS. 15A-15D: Support Tabs for Attaching Flexible Interconnect Circuits

Figure 15A:
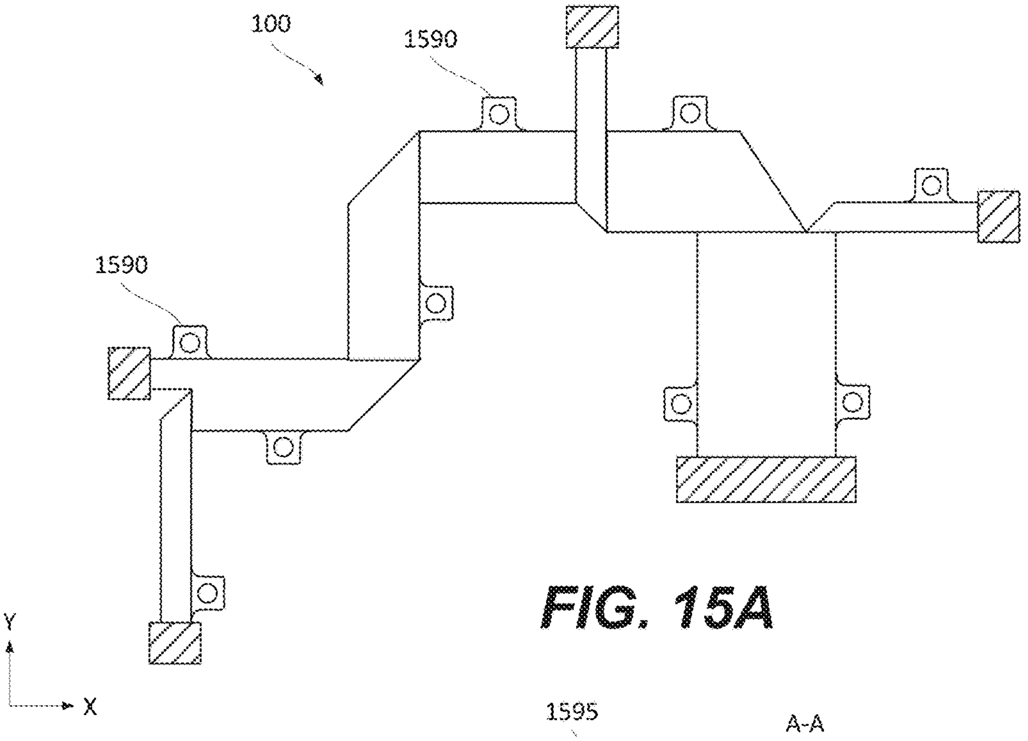
FIG. 15A is a schematic top view of a flexible interconnect circuit comprising support tabs for attaching this flexible interconnect circuit to a support structure, in accordance with some examples.

In some examples, flexible interconnect circuit 100 needs to be attached to a support structure. For example, flexible interconnect circuit 100 can be a car wire harness that is attached to various body panels during its installation. Flexible interconnect circuit 100 can comprise support tabs 1590 for this attachment as, e.g., is schematically shown in FIG. 15A. The number and position of these support tabs 1590 depend on the location of the attachment points.

Figure 15B:
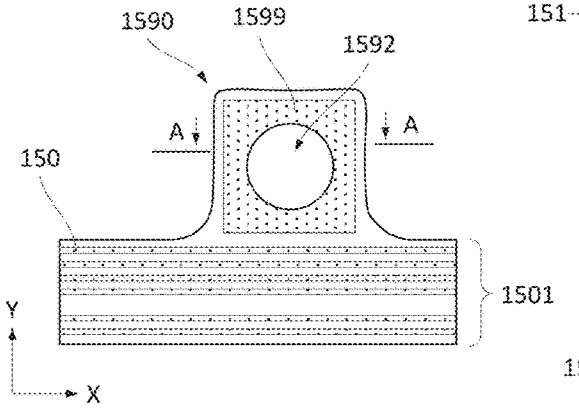
FIG. 15B is a schematic top cross-sectional view of a portion of the flexible interconnect circuit in FIG. 15A, illustrating various components of the support tab, in accordance with some examples.
Figure 15C:
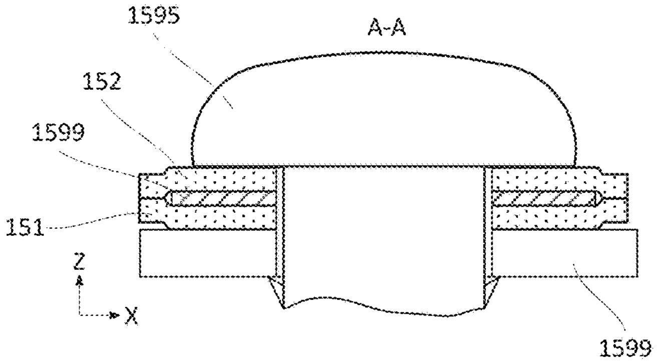
FIGS. 15C and 15D are schematic side cross-sectional views of a support tab, used in a flexible interconnect circuit, positioned over and attached to a support structure with a fastener, in accordance with some examples.
Figure 15D:
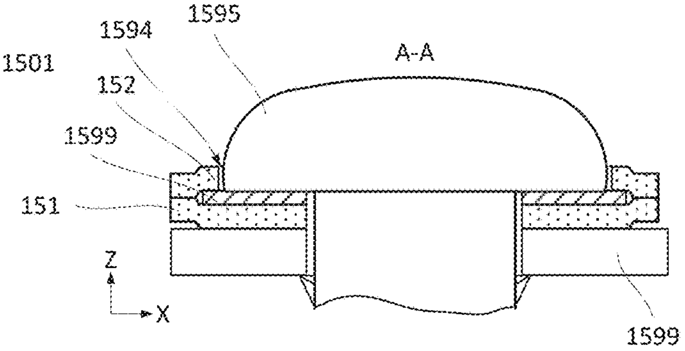

Referring to FIGS. 15B-15D, in some examples, flexible interconnect circuit 100 comprises first insulator layer 151 and second insulator layer 152 stacked with first insulator layer 151 and forming primary circuit portion 1501 and support tab 1590. Support tab 1590 extends from the edge of primary circuit portion 1501 as, e.g., shown in FIG. 15B. In some examples, support tab 1590 is monolithic with primary circuit portion 1501. For example, first insulator layer 151 and second insulator layer 152 can be continuous sheets extending between support tab 1590 and primary circuit portion 1501.

Referring to FIGS. 15B and 15C, support tab 1590 comprises support-tab opening 1592 for receiving fastener 1595 when securing flexible interconnect circuit 100 on support component 1599. Various examples of fastener 1595 are within the scope such as a clip, a screw, a rivet, and the like, e.g., as schematically shown in FIGS. 15C and 15D. Some examples of support component 1599 are described above with reference to FIGS. 7B and 7C and can be also referred to as base structures.

Referring to FIGS. 15B-15D, in some examples, flexible interconnect circuit 100 comprises conductive components (e.g., formed from the same metal sheet), which in turn comprises conductive traces 150 and support component 1599. Conductive traces 150 are at least partially positioned between first insulator layer 151 and second insulator layer 152 in primary circuit portion 1501. Support component 1599 is at least partially positioned between first insulator layer 151 and second insulator layer 152 in support tab 1590. Support component 1599 is used to reinforce support tab 1590 providing additional strength.

In some examples, conductive traces 150 and support component 1599 are formed from the same materials (e.g., copper, aluminum) and/or have the same thickness (e.g., at least 100 micrometers). For example, conductive traces 150 and support component 1599 can be formed by patterning the same metal sheet.

In some examples, support component 1599 is electrically isolated from each of conductive traces 150, e.g., as shown in FIG. 15B. For example, conductive traces 150 can be used for carrying power and/or signal between different parts of flexible interconnect circuit 100. At the same time, support component 1599 may come in electrical contact with fastener 1595 and/or support component 1599. Alternatively, support component 1599 is monolithic with at least one of conductive traces 150, e.g., operable as a ground wire (not shown).

Referring to FIG. 15B, in some examples, conductive traces 150 extend in a first direction, at least proximate to support tab 1590. Support tab 1590 extends from the edge of primary circuit portion 1501 in a second direction, substantially perpendicular to the first direction.

Referring to FIG. 15D, in some examples, second insulator layer 152 comprises second-insulator opening 1594 that is larger and concentric with support-tab opening 1592. Second insulator layer 152 partially exposes the surface of support component 1599 and allows fastener 1595 to interface the surface of support component 1599. For example, this direct interface may be used to form an electric connection, e.g., when support component 1599 and fastener 1595 are used for grounding purposes.

Figure 16A:
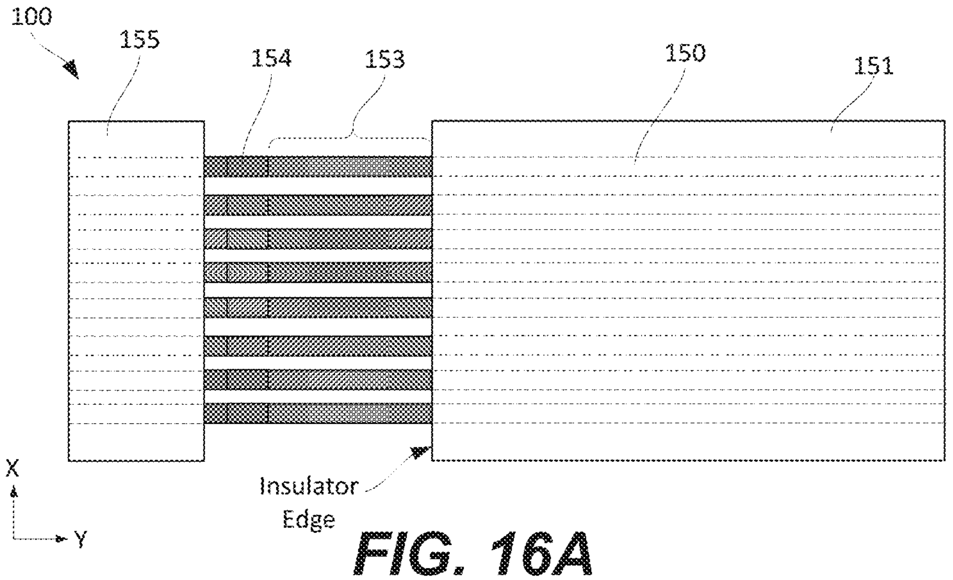
FIG. 16A is a top schematic view of a flexible interconnect circuit comprising contact traces with temporary support links, in accordance with some examples.
Figure 16B:
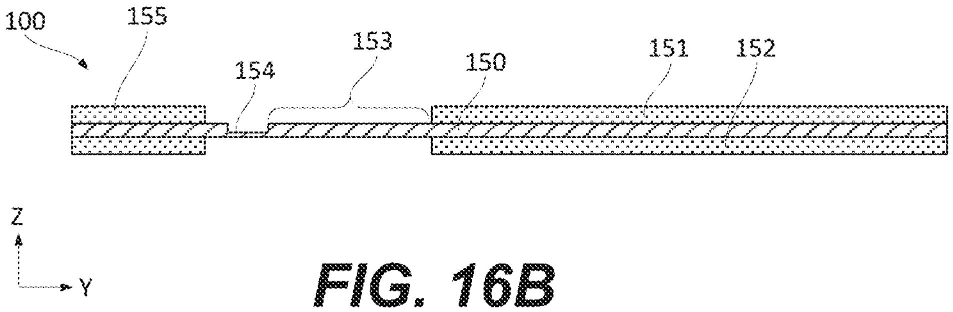
FIG. 16B is a side schematic view of the flexible interconnect circuit in FIG. 16B, which illustrates one example of the temporary support links, in accordance with some examples.
Figure 16C:
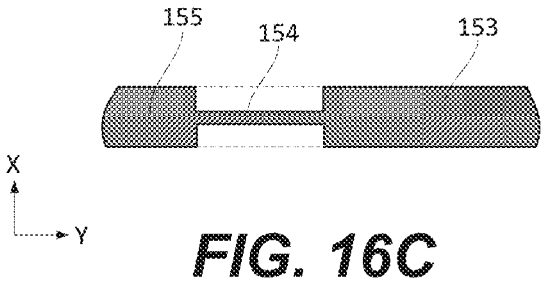
FIGS. 16C and 16D are top schematic views of a portion of the flexible interconnect circuit illustrating additional examples of the temporary support links, in accordance with some examples.
Figure 16D:
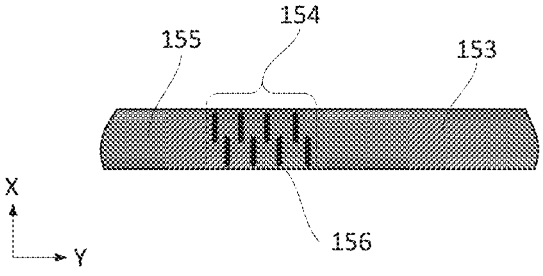
Figure 16E:
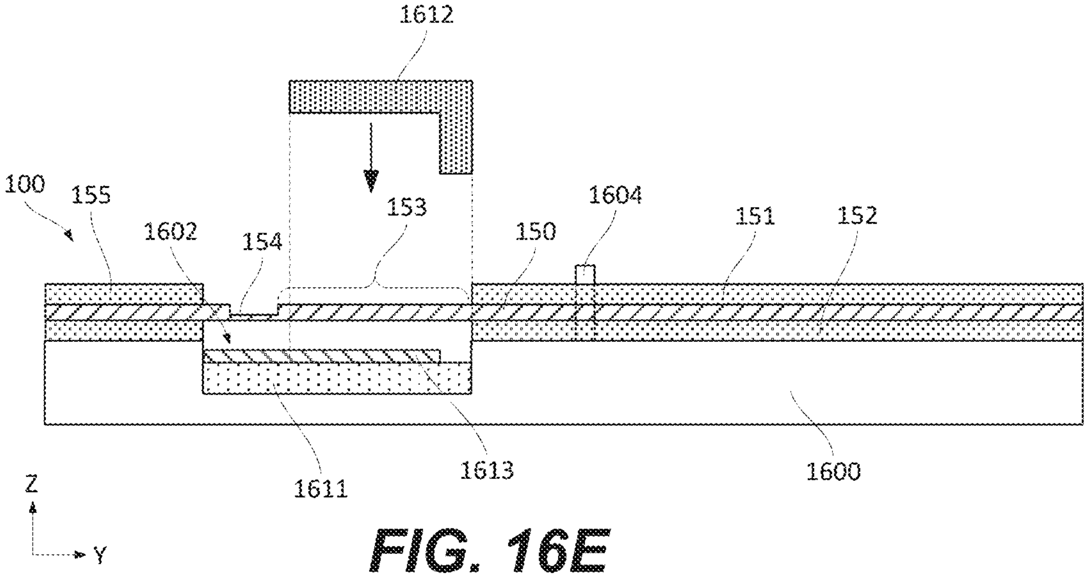
FIGS. 16E, 16F, and 16G are schematic side cross-sectional views of different stages while attaching a connector to the flexible interconnect circuit of FIGS. 16A-16B, in accordance with some examples.
Figure 16F:
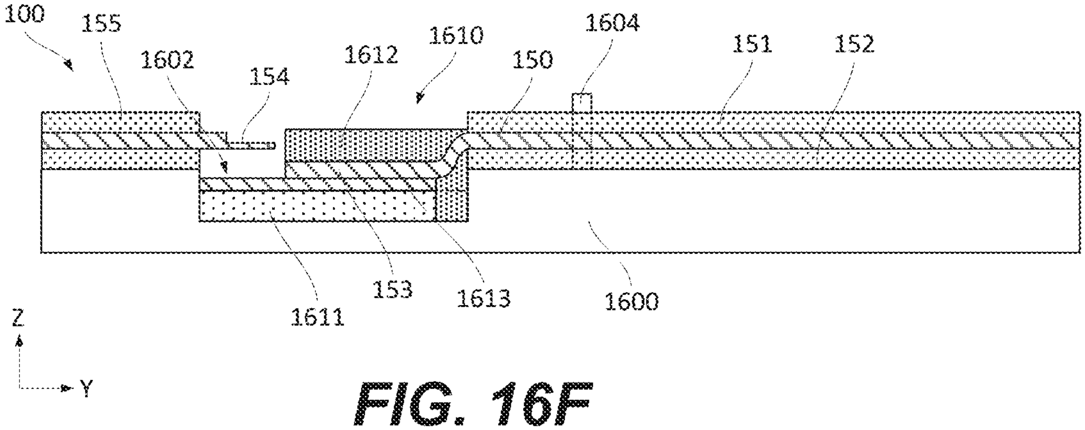
Figure 16G:
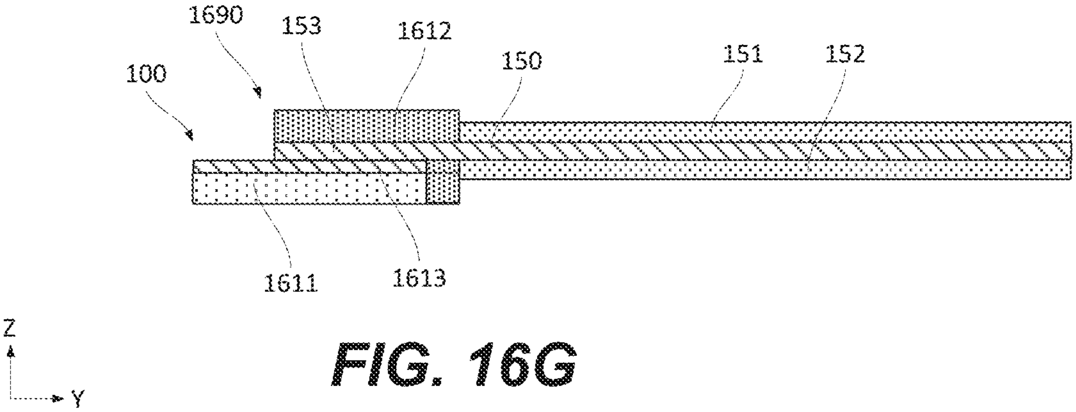

FIGS. 16A-16G: Attaching Connectors to Circuits With Traces Having Temporary Support Links In some examples, conductive traces 150 extend past the edges of first insulator layer 151 and second insulator layer 152 and can be used to form electrical connections, e.g., to connector conductive traces. If such conductive traces 150 are left unsupported (e.g., before forming these electrical connections), these conductive traces 150 can change their orientations (e.g., bend) and even contact each other (e.g., potentially causing electrical shorts). To avoid such issues, when such conductive traces 150 are formed, flexible interconnect circuit 100 can include support end 155 to which the ends of conductive traces 150 extend and connect to, e.g., as schematically shown in FIG. 16A. Specifically, support end 155 is a temporary part of flexible interconnect circuit 100 that is later removed, e.g., when a connector is attached to flexible interconnect circuit 100, e.g., as schematically shown in FIGS. 16E-16G and described below. Returning to FIG. 16A, each conductive trace 150 is connected to support end 155 by temporary support link 154, which can be monolithic with conductive trace 150. For example, all conductive traces 150 (forming the same conductive layer) and all temporary support links 154 (supporting these conductive traces 150) can be formed from the same metal sheet (e.g., foil) by patterning this sheet using various techniques. However, unlike conductive traces 150, the corresponding temporary support links 154 have a much weaker mechanical structure resulting in the fracturing of these temporary support links 154 when the force is applied to these temporary support links 154 and/or to conductive traces 150. For example, the tensile strength of these temporary support links 154 can be less than 50% than that of conductive traces 150 or less than 25% or even less than 10%. This difference in the tensile strength causes the fracture of temporary support links 154 before the fracture of any conductive traces 150.

Different examples of achieving this weaker mechanical structure are shown in FIGS. 16B-16D. Specifically, FIG. 16B illustrates temporary support link 154 having a smaller thickness than that of conductive trace 150. In some examples, the thickness of temporary support link 154 can be less than 50% than that of conductive trace 150 or less than 25% or even less than 10%. Various techniques (e.g., such as etching, ablation, and the like) can be used to achieve this thickness difference (i.e., forming temporary support link 154 from a portion of conductive trace 150). FIG. 16C illustrates another example in which temporary support link 154 has a smaller width than that of conductive trace 150. In some examples, the width of temporary support link 154 can be less than 50% than that of conductive trace 150 or less than 25% or even less than 10%. Various patterning techniques can be used to achieve this width difference (i.e., forming temporary support link 154 from a portion of conductive trace 150). FIG. 16D illustrates yet another example in which temporary support link 154 has cuts/perforations 156, which reduce the integrity of temporary support link 154. Various cutting/patterning techniques can be used to form these cuts/perforations in a portion of conductive trace 150 thereby forming temporary support link 154.

Referring to FIG. 16A, conductive traces 150 extending past the edges of first insulator layer 151 and second insulator layer 152 to temporary support links 154 can be referred to as contact portions 153. At this stage, these contact portions 153 are connected and monolithic with temporary support links 154, which support these contact portions 153 relative to supporting end 155. Specifically, additional parts of conductive traces 150 can extend into supporting end 155 and be supported relative to each other by first insulator layer 151 and second insulator layer 152. Supporting end 155, temporary support links 154, contact portions 153, and remaining parts of flexible interconnect circuit 100 can be formed by patterning three sheets (e.g., first insulator layer 151, second insulator layer 152, and metal foil forming all conductive components, including conductive traces 150 extending between first insulator layer 151 and second insulator layer 152).

FIGS. 16E-16G are schematic views of different stages while attaching connector 1610 to flexible interconnect circuit 100 of FIGS. 16A-16B, in accordance with some examples. In these examples, connector 1610 is formed by first connector portion 1611 and second connector portion 1612. First connector portion 1611 can include connector conductive traces 1613 that are designed to connect to contact portions 153 of flexible interconnect circuit 100. Referring to FIG. 16E, first connector portion 1611 is positioned within alignment cavity 1602 of assembly fixture 1600. Assembly fixture 1600 can also include alignment pins 1604, which can extend through corresponding aligning features of flexible interconnect circuit 100 thereby providing the X-Y alignment of flexible interconnect circuit 100 to first connector portion 1611.

Referring to FIG. 16E, at this stage, contact portions 153 of flexible interconnect circuit 100 extend over connector conductive traces 1613 and are supported by temporary support links 154. As noted above, temporary support links 154 help to maintain the alignment of contact portions 153, e.g., within the X-Y plane and now relative to connector conductive traces 1613. Referring to FIG. 16F, as second connector portion 1612 advances to flexible interconnect circuit 100 and eventually engages first connector portion 1611, second connector portion 1612 pushes on contact portions 153 and/or temporary support links 154 and eventually fractures temporary support links 154 thereby freeing the ends of contact portions 153 from support end 155 and allowing contact portions 153 to move toward and engage/interface/form electrical connections with connector conductive traces 1613. In some examples, second connector portion 1612 may also engage/be attached to first connector portion 1611 thereby forming a connector body. FIG. 16G illustrates an assembly comprising flexible interconnect circuit 100 and connector 1690 attached to flexible interconnect circuit 100 during the stages shown above in FIGS. 16E-16G.

Figure 17A:
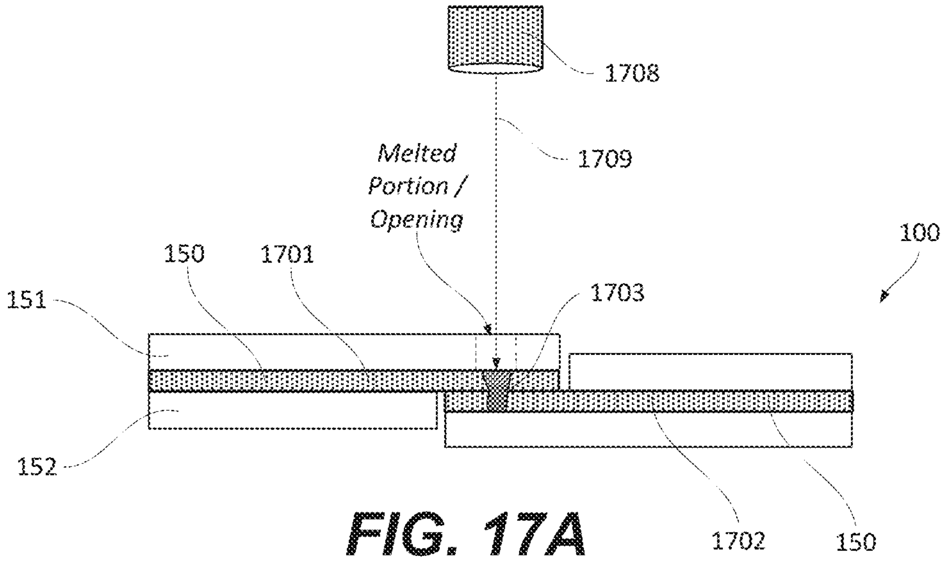
FIG. 17A is a schematic side cross-sectional view of a flexible interconnect circuit illustrating the two conductive layers being laser welded through the insulating layer positioned on the laser beam path, in accordance with some examples.
Figure 17B:
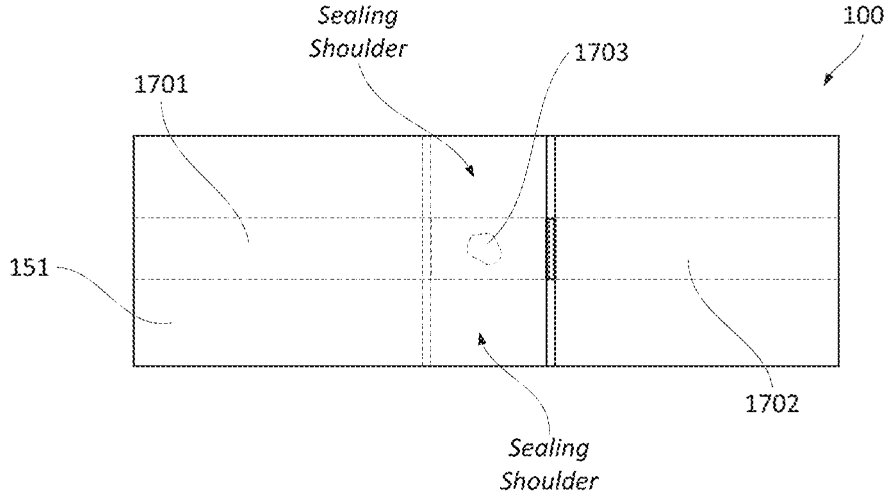
FIG. 17B is a schematic top view of a flexible interconnect circuit illustrating a weld nugget formed in the two conductive layers, in accordance with some examples.
Figure 17C:
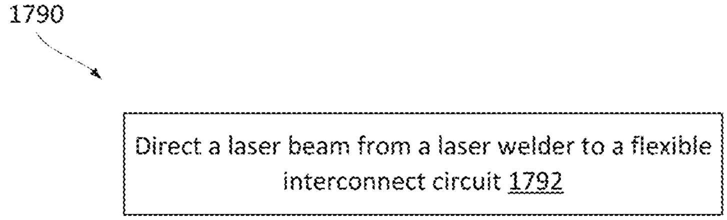
FIG. 17C is a process flowchart corresponding to a method for laser welding the two conductive layers of a flexible interconnect circuit through the insulating layer positioned on the laser beam path, in accordance with some examples.

FIGS. 17A-17C: Examples of Laser Welding Conductive Layers Through Insulator Layer Conductive traces 150 of the same or multiple flexible interconnect circuits 110 often need to be electrically interconnected. At the same time, these conductive traces 150 are typically positioned between first insulator layer 151 and second insulator layer 152. If conductive traces 150 are exposed while forming various electrical connections (e.g., by partially removing first insulator layer 151 and second insulator layer 152 from the connection area), additional insulators are often needed to seal conductive traces 150, which adds processing steps and components.

Some methods of connecting conductive traces 150, such as resistance welding and ultrasonic welding, require direct contact with these components. Laser welding does not require any direct physical contact but requires a laser beam to reach the surface of one conductive trace 150 to heat and partially melt this conductive trace 150 as well as another component positioned underneath to form a weld nugget. While a direct line of sight can be used between a laser welder and a top conductive component, the direct line of sight is not required. However, any components positioned between the laser welder and the top conductive component should be penetrable to the laser beam.

FIG. 17A is a schematic side cross-sectional view of flexible interconnect circuit 100 with first conductive layer 1701 and second conductive layer 1702 being laser welded through first insulator layer 151 positioned on the path of laser beam 1709, in accordance with some examples. During this laser welding, laser beam 1709 passes through first insulator layer 151 and interacts with first conductive layer 1701 causing first conductive layer 1701 to partially melt and form weld nugget 1703 together with second conductive layer 1702. FIG. 17B is a schematic top view of flexible interconnect circuit 100 illustrating weld nugget 1703 formed in first conductive layer 1701 and second conductive layer 1702 and positioned under first insulator layer 151.

FIG. 17C is a process flowchart corresponding to method 1790 for laser welding first conductive layer 1701 and second conductive layer 1702 of flexible interconnect circuit 100 through first insulator layer 151 positioned on the path of laser beam 1709, in accordance with some examples. In some examples, method 1790 comprises directing (block 1792) laser beam 1709 from laser welder 1708 to flexible interconnect circuit 100 such that laser beam 1709 passes through first insulator layer 151 of flexible interconnect circuit 100 and heats first conductive layer 1701 positioned under first insulator layer 151 and also heats second conductive layer 1702 positioned under first conductive layer 1701. This heating forms weld nugget 1703 between first conductive layer 1701 and second conductive layer 1702, wherein first insulator layer 151 is transparent to first insulator layer 151.

In some examples, first conductive layer 1701 and second conductive layer 1702 comprise one or more materials selected from the group consisting of copper and aluminum.

In some examples, flexible interconnect circuit 100 further comprises second insulator layer 152 such that first conductive layer 1701 and second conductive layer 1702 are stacked and sealed between first insulator layer 151 and second insulator layer 152 when directing laser beam 1709 from laser welder 1708 to flexible interconnect circuit 100 as, e.g., is schematically shown in FIG. 17A.

In some examples, first insulator layer 151 is at least partially melted or removed from the above weld nugget 1703. Alternatively, first insulator layer 151 seals weld nugget 1703 from the environment after weld nugget 1703 is formed.

Flexible interconnect circuit 100 fabricated in accordance with method 1790 can be used for various applications such as car seats, passenger cabin applications for low-voltage wiring, and the like. In these applications, exposed conductors are not desired. For example, method 1790 can comprise (block 1792) directing laser beam 1709 from laser welder 1708 to flexible interconnect circuit 100.

Figure 18A:
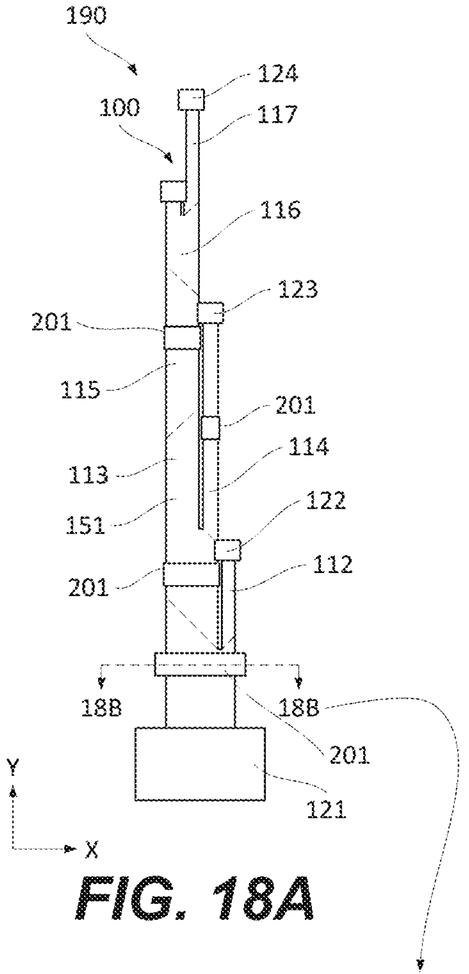
FIG. 18A is a schematic planar view of a molded seal flexible interconnect circuit in a pre-folded state with a first side facing up, in accordance with some examples, in accordance with some examples.
Figure 18B:
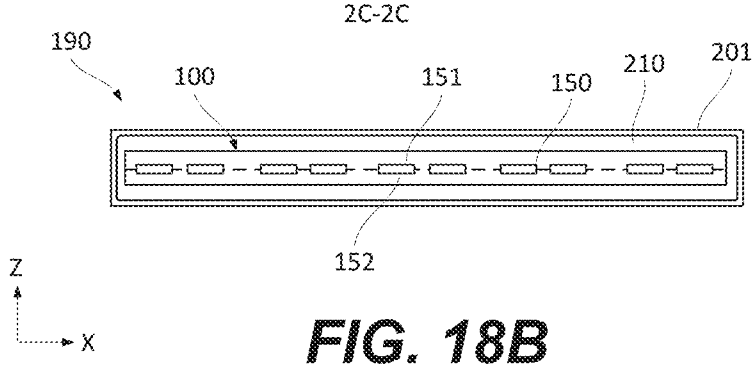
FIG. 18B is a schematic cross-sectional view of the molded seal flexible interconnect circuit in FIG. 18A in accordance with some examples.

FIGS. 18A-18B: Flexible Interconnect Circuits

FIG. 18A is a schematic planar view of flexible interconnect circuit assembly 190 in a pre-folded state, similar to the one described above with reference to FIG. 1A. FIG. 18B is a schematic cross-sectional view of flexible interconnect circuit assembly 190 in FIG. 18A. In addition to various features of flexible interconnect circuit assembly 190 described above with reference to FIGS. 1A-4B, flexible interconnect circuit assembly 190 (shown in FIGS. 18A and 18B) comprises molded seals 201, positioned on various portions of flexible interconnect circuit 100. In various examples, molded seal 201 may be overmolded onto the respective portions of flexible interconnect circuit 100, such as first insulating layer 151 and second insulating layer 152. Molded seals 201 provide the protection, sealing, and support for passing flexible interconnect circuit 100 through openings or gaps in a structure or for passing flexible interconnect circuit 100 into various components or assemblies (e.g., a control circuit box). In various examples, support features for the overmolded portions of the flex circuit may also be described herein.

Molded seal 201 may be formed (e.g., molded) from rubber, plastic, composites, and/or other material appropriate for overmolding. Various examples of such materials may include, for example, butyl (e.g., isobutylene isoprene elastomer), nitrile, styrene-butadiene rubber (SBR), polyvinyl chloride (PVC), vulcanized rubber, ethylene propylene diene monomer rubber (EPDM) rubber, and/or other such materials. The material(s) used may vary based on application. For applications that require resistance to water, steam, alkalis, and/or other conditions, butyl may be used. Nitrile and/or SBR may provide damping and good hot tear strength as well as resistance to certain oils, alcohol, and other materials. PVC grommets, vulcanized rubber, or EPDM may also be used (e.g., for non-injection molding overmolding manufacturing techniques, such as compression molding or transfer molding).

Molded seal 201 may allow for flexible interconnect circuit assembly 190 to pass through various features that may not provide sufficient support to flexible interconnect circuit 100 and/or may damage flexible interconnect circuit 100. Molded seal 201 may, thus, provide protection and/or support to portions of flexible interconnect circuit 100, allowing for flexible interconnect circuit assembly 190 to pass through, undamaged, various openings and/or regions (e.g., opening). Molded seal 201 may, additionally or alternatively, provide sealing for openings that allow for flexible interconnect circuit 100 to pass through. Thus, for example, electronic control unit (ECU) boxes may need to be sealed from the environment (e.g., sealed to prevent moisture, dust, or other foreign objects from entering the ECU box). As the opening that allows for flexible interconnect circuit 100 to pass through on the ECU box may not conform perfectly to flexible interconnect circuit 100, molded seal 201 may provide a compressible seal that can fill the opening and prevent ingress of foreign objects into the ECU box. In various other example examples, molded seals may be utilized to provide sealing as door seals, liftgate or tailgate seals, seals within the interior of a vehicle, seals within the engine bay of a vehicle, and/or for various other applications that may require sealing.

Molded seal 201 may be formed through various techniques. Such techniques may include, for example, overmolding and insert molding. The molding techniques may include, for example, injection molding, compression molding, transfer molding, and/or other single-shot or multi-shot molding processes. In some examples, molded seal 201 may be molded with a process (e.g., injection) temperature that is lower than the melting point of flexible interconnect circuit 100 or, more specifically, lower than the melting point of various components (e.g., first insulating layer 151, second insulating layer 152, and various other adhesives and insulators used for insulating and sealing conductive traces 150). However, in examples where overmolding temperatures exceeds the acceptable temperatures of these components (e.g., injection temperature for certain types of thermoplastics may be between 180-240° C.), protector collar 210 may be utilized to prevent damage to flexible interconnect circuit 100 (e.g., by providing a thermal barrier thereby preventing melting and/or damage from molding pressures) and/or hold flexible interconnect circuit 100 in the correct position during molding. Protector collar 210 may, in certain examples, be a nylon, composite, steel, aluminum, or other like materials. When conductive materials are used, such base materials may be accordingly insulated. Protector collar 210 may, thus, be positioned around the corresponding section of flexible interconnect circuit 100 before molded seal 201 is molded around flexible interconnect circuit 100.

FIGS. 19A-19E: Examples of Flexible Interconnect Circuits With Carriers

Figure 19A:
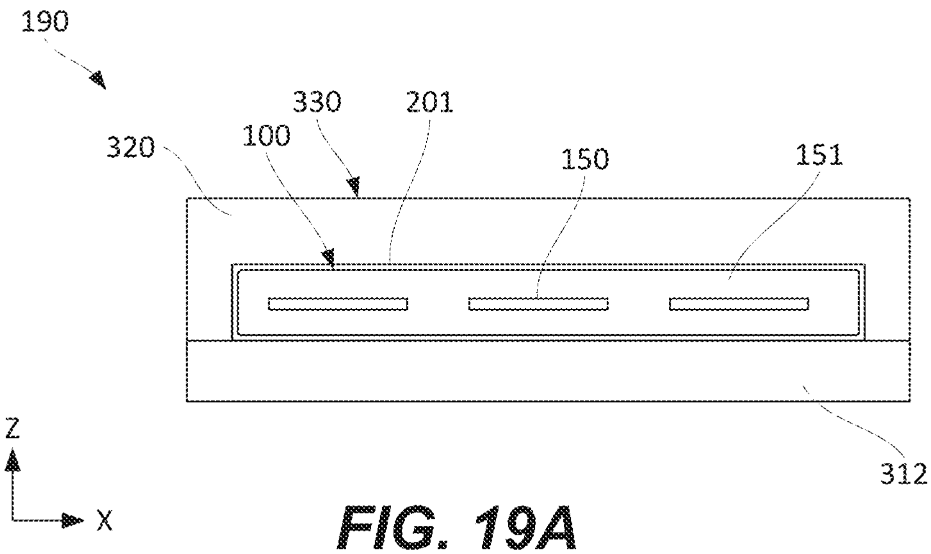
FIGS. 19A, 19B, 19C, 19D, and 19E, illustrate views of a molded seal flexible interconnect circuit positioned within certain assemblies, in accordance with some examples.
Figure 19B:
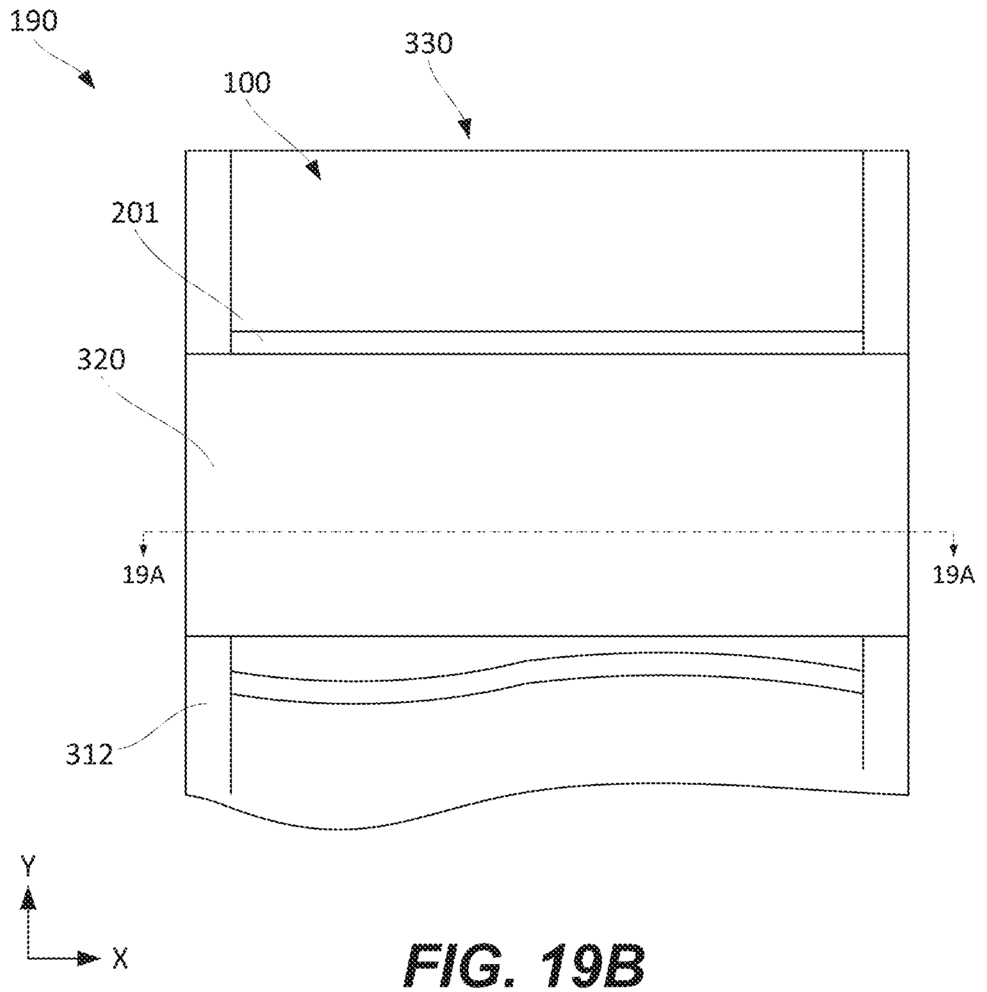

FIGS. 19A, 19B, 19C, 19D, and 19E, illustrate different views of flexible interconnect circuit assembly 190 comprising flexible interconnect circuit 100, molded seal 201, and circuit carrier 330. Specifically, flexible interconnect circuit 100 may be positioned within circuit carrier 330. FIG. 19B is a vertical view of assembly 190 and FIG. 19A illustrates a cross-section view of flexible interconnect circuit assembly 190 along line 19A-19A of FIG. 19B.

Circuit carrier 330 may be an example of a structure that provides support for a flexible interconnect circuit 100. For example, circuit carrier 330 may support a flexible interconnect circuit 100 across openings. In various examples, carrier 330 is a rigid or semi-rigid structure that provides support to flexible interconnect circuit 100 where needed (e.g., over a gap, such as over the opening span). In some examples, carrier 330 also allows some bending rigidity to allow supported movement and protection to flexible interconnect circuit 100.

In various examples, flexible interconnect circuit 100 is positioned onto circuit carrier 330 and may be secured to circuit carrier 330 by, for example, an adhesive, such as a pressure-sensitive adhesive (PSA). In various examples, other fastening techniques, such as mechanical fasteners and other techniques, may be employed, additionally or alternatively, to secure flexible interconnect circuit 100 onto circuit carrier 330.

In various examples, circuit carrier 330 may include cover 320 and base structure 312. Flexible interconnect circuit 100 may be positioned between cover 320 and base structure 312. Cover 320 may be coupled to base structure 312 (e.g., according to techniques described herein), to hold flexible interconnect circuit 100 within circuit carrier 330.

In various examples, molded seal 201 may be positioned around flexible interconnect circuit 100. Molded seal 201 is positioned between flexible interconnect circuit 100 and circuit carrier 330 and provides for protection for flexible interconnect circuit 100 and/or sealing of the opening within circuit carrier 330 that flexible interconnect circuit 100 passes within. Molded seal 201 may be any type of molded seal as described herein.

Figure 19C:
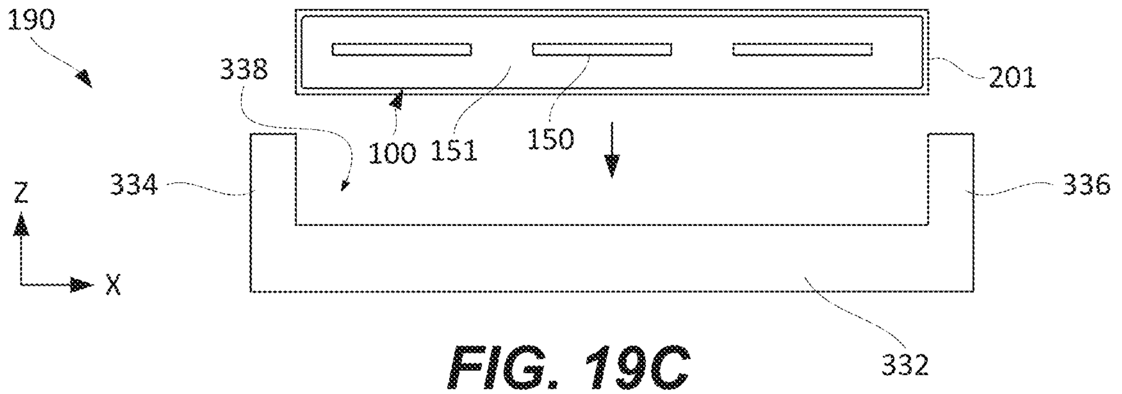
Figure 19D:
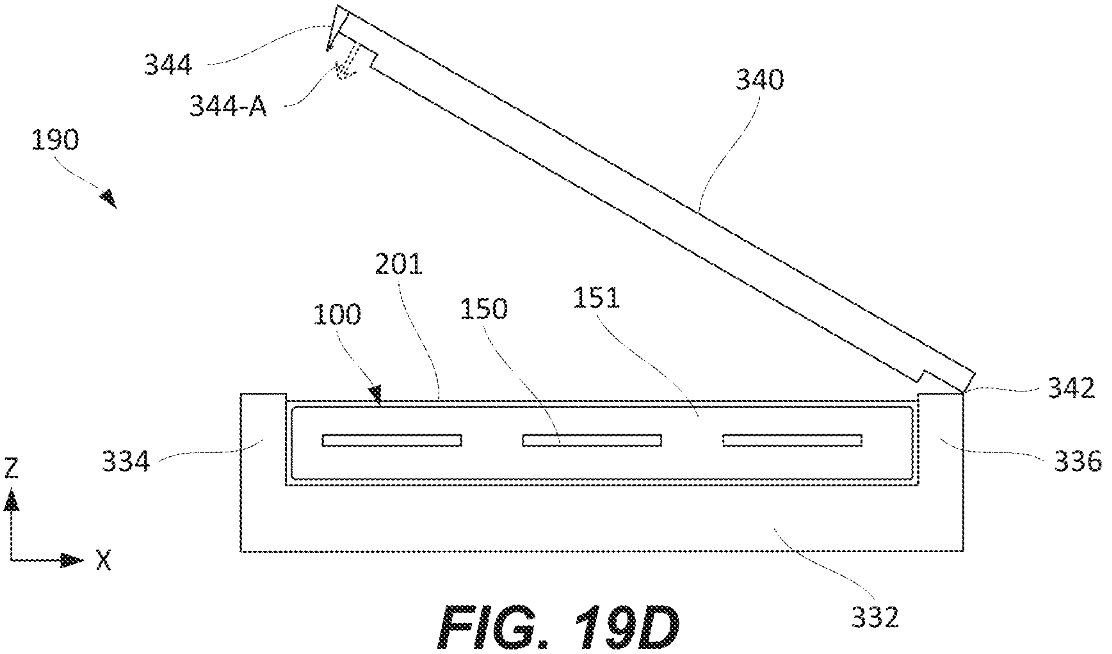
Figure 19E:
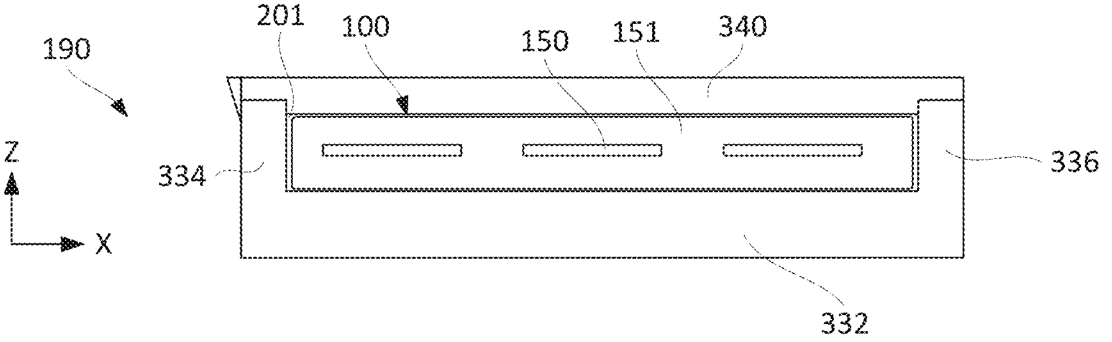

FIGS. 19C-E illustrate a technique of coupling a flexible interconnect circuit to a circuit carrier. In FIG. 19C, flexible interconnect circuit 100, which may be overmolded with molded seal 201, is inserted into bottom portion 332. Bottom portion 332 may include cavity 338 for receiving flexible interconnect circuit 100. Cavity 338 may be defined, at least in part, by sides 334 and 336, which are configured to hold flexible interconnect circuit 100 within cavity 338.

In FIG. 19D, after flexible interconnect circuit 100 has been inserted into cavity 338, cover portion 340 may be placed over cavity 338. Cover portion 340 may hold flexible interconnect circuit 100 in place within cavity 338. In some examples, base portion 332 and cover portion 340 are separate individual pieces (e.g., separately attached to base structure 312 and cover 320, respectively, or may be a all or a portion thereof of base structure 312 and cover 320, respectively). In such examples, cover portion 340 may rotate into position along hinge 342. In additional examples, base portion 332 and cover portion 340 may be a single continuous assembly. In such examples, cover portion 340 may be hinged to base portion 332 via hinge 342.

In FIG. 19E, cover portion 340 may be moved into a closed position. The closed position may hold flexible interconnect circuit 100 within cavity 338. In certain examples, molded seal 201 may be compressed when cover portion 340 is in the closed position, to provide protection and sealing to flexible interconnect circuit 100.

Cover portion 340 may include securing mechanism 344. Securing mechanism 344 may be, for example, a latch or catch which will attach onto another portion of the carrier (e.g., base portion 332) in order to secure cover portion 340 in a closed position. For example, securing mechanism 344 may include a hook or snap that may interface with an insertion point on the external side of bottom portion 332. An alternate configuration for securing mechanism 344 is shown by securing mechanism 344-A, which may also have a hooked configuration. Securing mechanism 344-A may be inserted into a recess positioned at the top side of bottom portion 332.

Figure 20A:
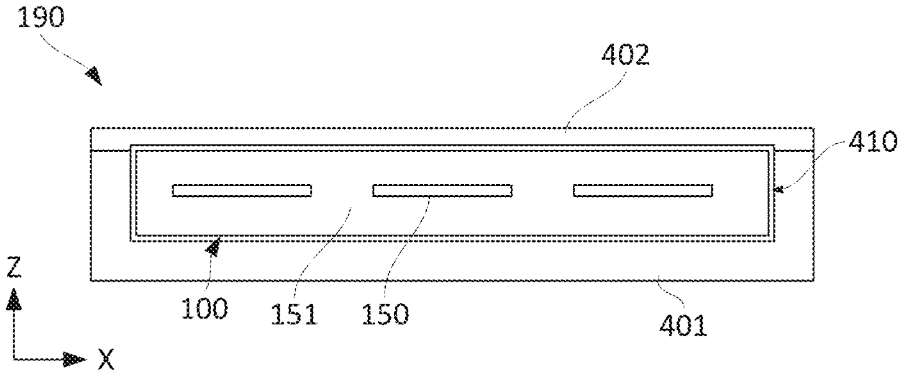
FIGS. 20A and 20B illustrate cross-sectional views of another example molded seal flexible interconnect circuit positioned within certain assemblies, in accordance with some examples.
Figure 20B:
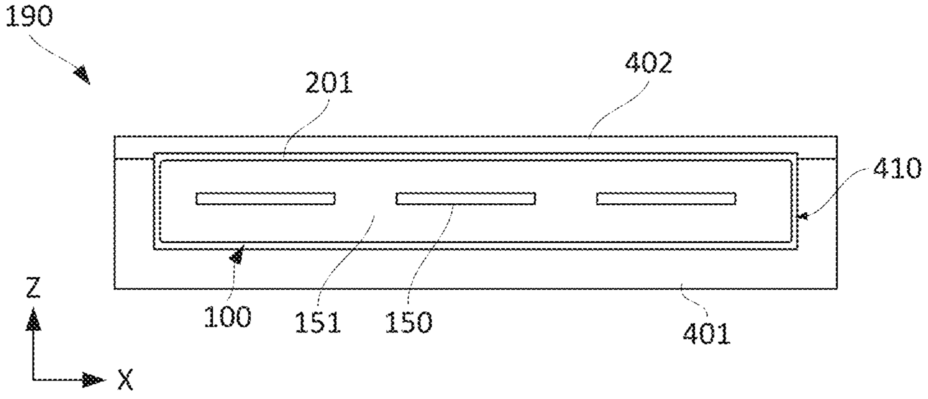

FIGS. 20A and 20B illustrate cross-sectional views of additional examples of flexible interconnect circuit assembly 190. Flexible interconnect circuit assembly 190 includes space 410 between flexible interconnect circuit 100 and cover portion 402 as well as base portion 401. In the examples shown in FIG. 20A, flexible interconnect circuit assembly 190 does not include a molded seal. FIG. 20B illustrates another example with flexible interconnect circuit assembly 190 comprising molded seal 201, positioned within space 410. Molded seal 201 thus acts as a gasket for flexible interconnect circuit 100, providing for sealing as well as preventing unrestrained movement of flexible interconnect circuit 100 within space 410 and, thus preventing damage from such unrestrained movement.

FIGS. 21A-G: Forming of Flexible Interconnect Circuits

Various examples of forming molded seal flexible interconnect circuits are described herein. For the purposes of this disclosure, it is appreciated that various examples may utilize one, some, or all such features described. Thus, for example, molded seal flexible interconnect circuits that are formed with lower pressure molding techniques (e.g., lower pressures than injection molding, such as compression molding or transfer molding) may not include one, some, or all such features described (e.g., a protector collar may not be used for such forming techniques).

Figure 21A:
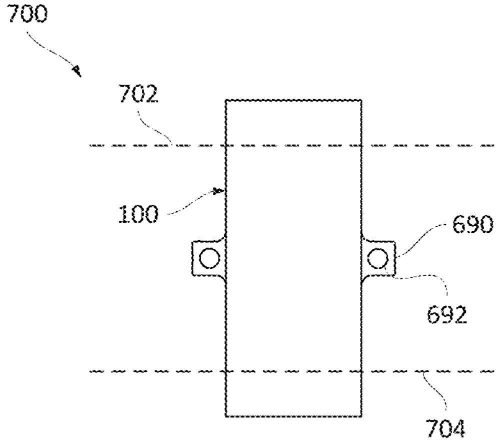
FIGS. 21A and 21B illustrate schematic planar views illustrating a technique of forming a molded seal flexible interconnect circuit, in accordance with some examples.
Figure 21B:
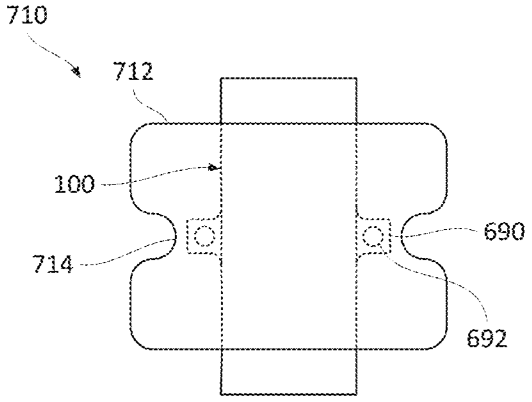

FIGS. 21A and 21B illustrate schematic planar views illustrating a technique of forming a molded seal flexible interconnect circuit, in accordance with some examples. FIG. 21A illustrates forming scenario 700 for molding seals onto flexible interconnect circuit 100. In forming scenario 700, edges 702 and 704 are the edges of the cavity for forming molded seals on flexible interconnect circuit 100. Flexible interconnect circuit 100 further includes one or more support tabs 690 with openings 692. Support tabs 690 of forming scenario 700 may be positioned within edges 702 and 704 of the tooling and, thus, positioned within the molding cavity of the tool during molding.

FIG. 21B illustrates forming scenario 710 where a portion of flexible interconnect circuit 100 is positioned within molding cavity 712. The molding tool of molding cavity 712 may include pins configured to pass through openings 692. Such pins may hold flexible interconnect circuit 100 in place during molding, preventing the deformation of flexible interconnect circuit 100 from the pressures of molding. Molding cavity 712 may also include indent 714. Indent 714 may form a depression within the molded seal, allowing for the molded seal and, thus, flexible interconnect circuit 100, to be secured within an opening.

Figure 21C:
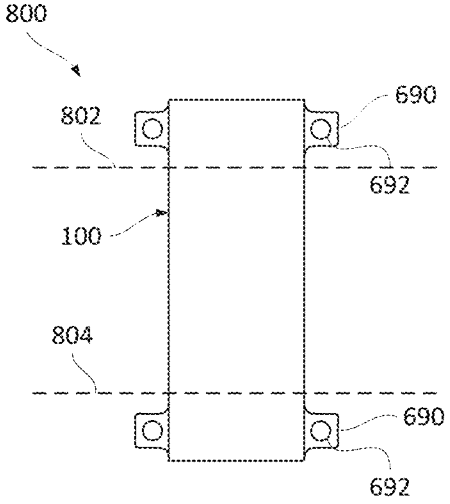
FIGS. 21C and 21D illustrate schematic planar views illustrating another technique of forming a molded seal flexible interconnect circuit, in accordance with some examples.
Figure 21D:
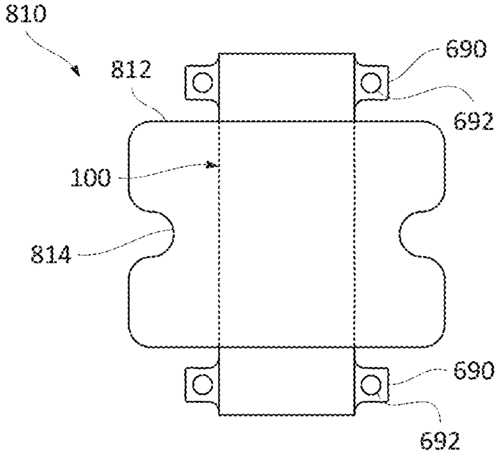

FIGS. 21C and 21D illustrate schematic planar views illustrating another technique of forming a molded seal flexible interconnect circuit, in accordance with some examples. FIG. 21C illustrates forming scenario 800 that includes flexible interconnect circuit 100 which includes a plurality of support tabs 690 with openings 692 that are positioned outside of the area defined by edges 802 and 804. Thus, the plurality of support tabs 690 is positioned proximate to the molded seal. Edges 802 and 804 are the edges of the tooling for forming molded seals on flexible interconnect circuit 100. Thus, support tabs 690 are positioned outside of the molding cavity.

FIG. 21D illustrates forming scenario 810 where a portion of flexible interconnect circuit 100 is positioned within molding cavity 812. The molding tool associated with molding cavity 812 may include pins configured to pass through openings 692. Molding cavity 812 may also include indent 814 for forming a depression within the molded seal.

Figure 21E:
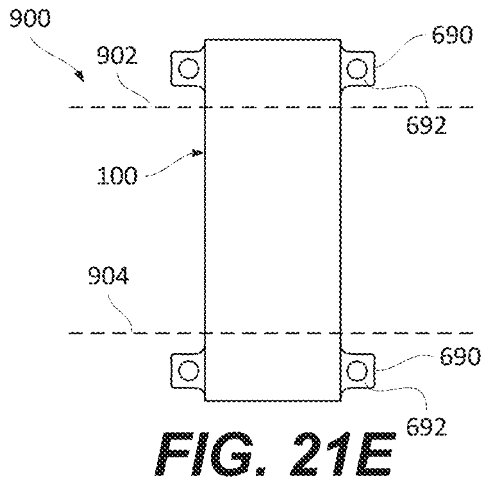
FIGS. 21E, 21F, and 21G illustrate schematic planar views illustrating a further technique of forming a molded seal flexible interconnect circuit, in accordance with some examples.
Figure 21F:
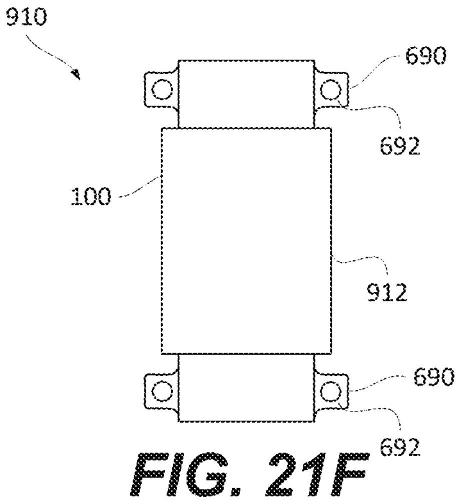
Figure 21G:
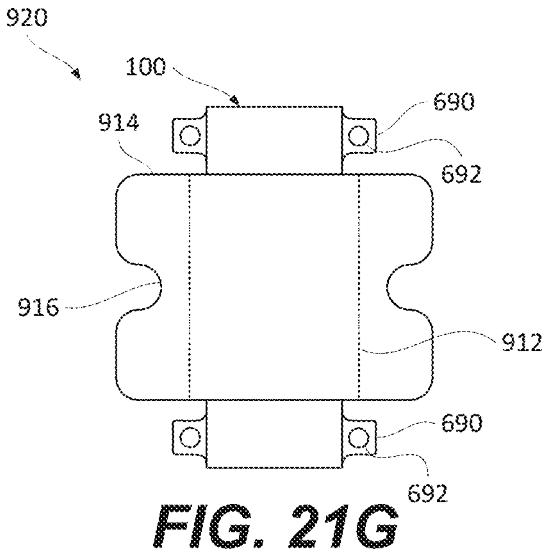

FIGS. 21E, 21F, and 21G illustrate schematic planar views illustrating a further technique of forming a molded seal flexible interconnect circuit, in accordance with some examples. FIG. 9A illustrates forming scenario 900 that includes flexible interconnect circuit 100 that includes support tabs 690 with openings 692. Flexible interconnect circuit 100 may be configured to be positioned within a molding cavity defined by edges 902 and 904.

In forming scenario 910 of FIG. 21F, protector collar 912 is inserted around flexible interconnect circuit 100. Protector collar 912 may provide protection to flexible interconnect circuit 100 from the pressure, temperature, or other aspects of molding. Protector collar 912 may be as described herein.

In forming scenario 920 of FIG. 21G, molding cavity 914 is positioned over flexible interconnect circuit 100 and protector collar 912. The molding tool of molding cavity 914 may, thus, form a molded seal over protector collar 912. In various examples, protector collar 912 may be positioned over flexible interconnect circuit 100 and may remain positioned over flexible interconnect circuit 100 after forming of the molded seal. Pins may be positioned through openings 692 to hold flexible interconnect circuit 100 in place during forming of the molded seal. Molding cavity 914 may also include indent 916 for forming a depression within the molded seal.

Figure 22:
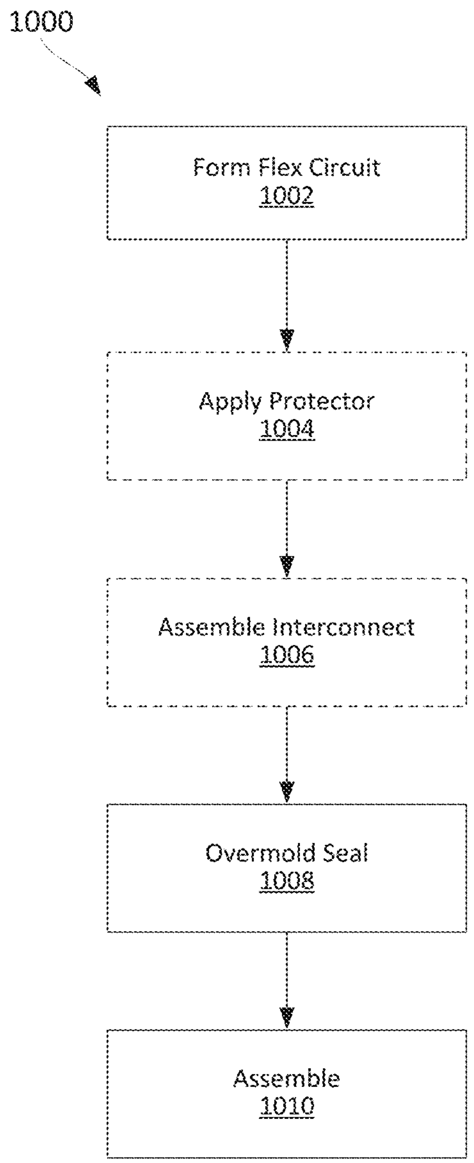
FIG. 22 illustrates a process flow chart corresponding to an example method for forming a molded seal flexible interconnect circuit, in accordance with one or more examples.

FIG. 22 illustrates a process flow chart corresponding to an example method for forming a molded seal flexible interconnect circuit, in accordance with one or more examples. FIG. 22 illustrates process 1000 for forming a molded seal flexible interconnect circuit and assembling the molded seal flexible interconnect circuit. In 1002, the flexible interconnect circuit is formed. Thus, for example, the various layers and electrical circuits and/or traces of the flexible interconnect circuit is formed in 1002.

In optional 1004, a protector collar is applied to one or more portions of the flexible interconnect circuit. The protector collar may be as described herein and may protect the flexible interconnect circuit from the pressure and/or temperatures of molding. Certain forming techniques may not require a protector collar and, thus, no protector collar may be positioned on flexible interconnect circuit 100 in such techniques.

In optional 1006, flexible interconnect circuit 100 may be assembled. Thus, any additional components, such as a connectors may be assembled in 1006. Additionally or alternatively, the flexible interconnect circuit may be cut and/or bent as required.

In 1008, one or more seals may be overmolded onto the flexible interconnect circuit, according to the techniques described herein. In various examples, the flexible interconnect circuit may be supported (e.g., via pins inserted into openings of the flexible interconnect circuit) and/or protected (e.g., by protector collars) as described herein. Various other techniques may utilize molding of parameters (e.g., of certain pressures and/or temperatures) that do not require reinforcement or support of a flexible interconnect circuit during molding. In 1010, the finished flexible interconnect circuit is produced and is assembled (e.g., assembled to a vehicle).

Alternatively, the seal can be overmolded before assembly and other operations for finalizing the flexible interconnect circuit in optional 1008.

Figure 23A:
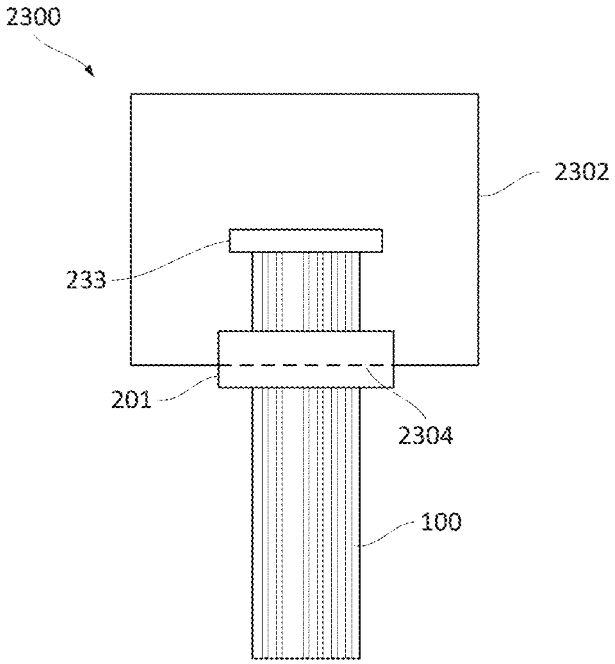
FIGS. 23A, 23B, and 23C illustrate schematic planar views illustrating molded seal flexible interconnect circuits in various assemblies, in accordance with some examples.
Figure 23B:
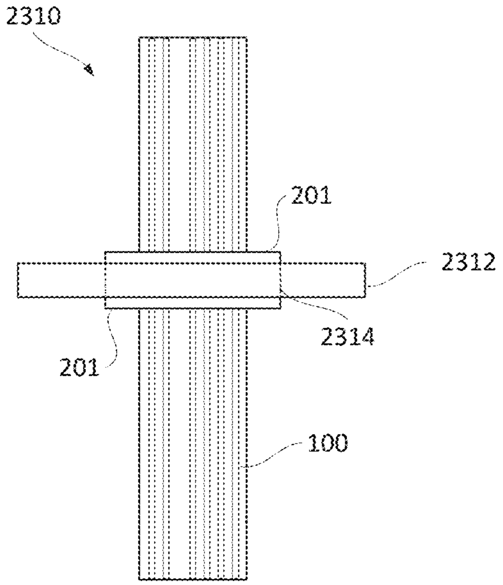
Figure 23C:
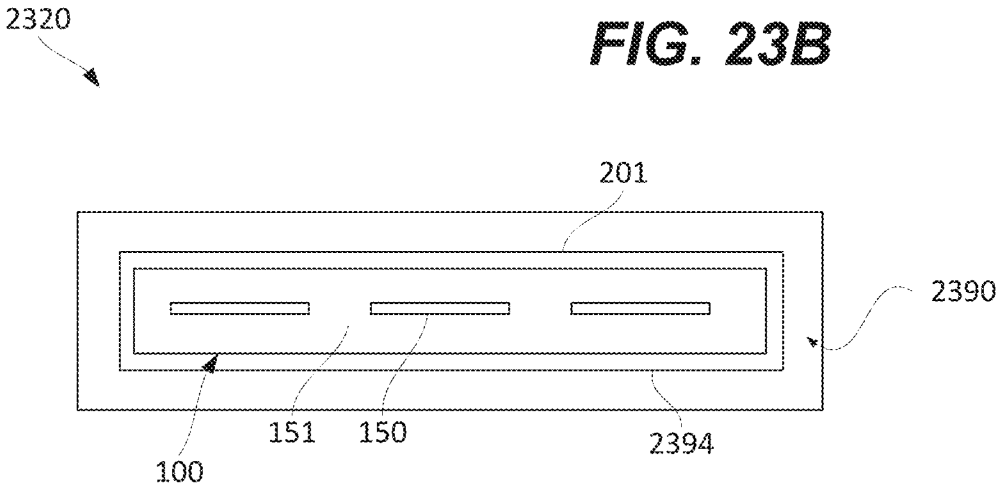

FIGS. 23A-23C: Example Assemblies

FIGS. 23A-C illustrate schematic planar views illustrating molded seal flexible interconnect circuits in various assemblies, in accordance with some examples. As illustrated in FIGS. 23A-C, flexible interconnect circuits with molded seal may allow for sealing and protection when passing through various openings. Such sealing may be an inherent protection of flexible interconnect circuits with molded seals and, thus, an additional seal or other components may not be needed to provide for the required sealing and/or protection. Accordingly, part counts, attendant logistics, and assembly time may be reduced.

FIG. 23A illustrates assembly 2300 that includes control unit 2302 and flexible interconnect circuit 100. Flexible interconnect circuit 100 includes molded seal 201 and electrical connection 233. Control unit 2302 may be, for example, an electronic control unit (ECU). Flexible interconnect circuit 100 may terminate inside of control unit 2302. Thus, for example, electrical connection 233 may be a connector and/or an electrical connection that is coupled to various circuitry within control unit 2302 (e.g., a soldered connection).

Flexible interconnect circuit 100 may pass into control unit 2302 through opening 2304 of control unit 2302. Molded seal 201 may be positioned on flexible interconnect circuit 100 at a location that would allow molded seal 201 to provide protection and/or sealing where flexible interconnect circuit 100 passes through opening 2304. Thus, for example, control unit 2302 may require certain sealing characteristics (e.g., to prevent dust intrusion). As opening 2304 does not perfectly conform with flexible interconnect circuit 100, molded seal 201 may seal opening 2304.

FIG. 23B illustrates assembly 2310 that includes bulkhead 2312 and flexible interconnect circuit 100. In various examples, bulkhead 2312 may be a partition, firewall, and/or another such structure. As electrical connections may need to pass from one side of bulkhead 2312 to the other side, bulkhead 2312 may include opening 2314 that allows for flexible interconnect circuit 100 to pass from one side to the other side (e.g., from one side of a vehicle to another side of the vehicle).

Flexible interconnect circuit 100 includes molded seal 201. As opening 2314 may be formed from, for example, sheet metal or machined metal and may, thus, include sharp edges that may damage an electrical circuit, molded seal 201 may provide protection to the portion of flexible interconnect circuit 100 that passes through opening 2314. Molded seal 201 may also provide sealing for opening 2314 and, thus, seal off one side of bulkhead 2312 from the other side.

FIG. 23C illustrates assembly 2320 that includes component 2390 and flexible interconnect circuit 100. Component 2390 includes opening 2394. Component 2390 may be, for example, a door, fascia, window, firewall, and/or another such component. Component 2390 may include sealing requirements. As shown in FIG. 23C, molded seal 201 of flexible interconnect circuit 100 may be compressible and may expand to occupy the area of opening 2394, allowing for sealing of opening 2394 that flexible interconnect circuit 100 passes through. Accordingly, molded seal 201 may provide protection from the outside environment of a vehicle even though portions of flexible interconnect circuit 100 may pass from a "dry" interior side of the vehicle (where liquid and dust intrusion would need to be eliminated or minimized) to a "wet" exterior side of the vehicle.

CONCLUSION

It is to be understood that the above description is intended to be illustrative, and not restrictive. For example, the above-described examples (and/or aspects thereof) may be used in combination with each other. In addition, many modifications may be made to adapt a particular situation or material to the teachings presented herein. Dimensions, types of materials, orientations of the various components, and the number and positions of the various components described herein are intended to define parameters of some examples and are by no means limiting and are merely examples. Many examples and modifications within the spirit and scope of the claims will be apparent to those of skill in the art upon reviewing the above description.

The invention claimed is:

1. A flexible interconnect circuit assembly comprising:

a flexible interconnect circuit comprising a first insulator layer, a second insulator layer, and conductive traces, wherein:

the first insulator layer and the second insulator layer define a first edge and a second edge of the flexible interconnect circuit, the conductive traces are positioned between the first insulator layer and the second insulator layer, and the conductive traces are offset relative to each other between the first edge and the second edge in a portion of the flexible interconnect circuit, the conductive traces are formed from a metal sheet, and the conductive traces have a uniform thickness throughout a boundary of the flexible interconnect circuit; and a molded seal enclosing the portion of the flexible interconnect circuit, wherein:

the molded seal is overmolded or insert-molded over both the first insulator layer and the second insulator layer (a) such that the molded seal surrounds upper, lower, and side surfaces of the first insulator layer and the second insulator layer in the portion of the flexible interconnect circuit and (b) such that each of the first insulator layer and the second insulator layer is positioned between the molded seal and the conductive traces, at least some of the upper, lower, and side surfaces of the first insulator layer and the second insulator layer is exposed to environment away from the molded seal, and the molded seal is formed from a material selected from the group consisting of butyl, nitrile, styrene-butadiene rubber, polyvinyl chloride, vulcanized rubber, and ethylene propylene diene monomer rubber.

2. The flexible interconnect circuit assembly of claim 1, further comprising a first connector and a second connector, wherein:

the conductive traces interconnect connector terminals in the first connector and the second connector, and the portion of the flexible interconnect circuit enclosed by the molded seal is positioned between the first connector and the second connector.

3. The flexible interconnect circuit assembly of claim 1, further comprising an electronic control unit, wherein:

the electronic control unit comprises an opening, the flexible interconnect circuit extends through the opening, the conductive traces are connected to the electronic control unit, and the molded seal is positioned at the opening of the electronic control unit filling the opening and preventing ingress into the electronic control unit thereby forming a compressible seal.

4. The flexible interconnect circuit assembly of claim 1, wherein the molded seal is configured to provide sealing as one or more of a door seal, a liftgate seal, a tailgate seal, a vehicle interior seal, and an engine bay seal.

5. The flexible interconnect circuit assembly of claim 1, wherein the molded seal has a lower melting temperature than the first insulator layer and the second insulator layer.

6. The flexible interconnect circuit assembly of claim 1, wherein the molded seal directly interfaces each of the first insulator layer and the second insulator layer.

7. The flexible interconnect circuit assembly of claim 1, further comprising a protector collar positioned between the molded seal and each of the first insulator layer and the second insulator layer, wherein the protector collar is operable as a thermal barrier when forming the molded seal.

8. The flexible interconnect circuit assembly of claim 7, wherein the protector collar is further operable to align the flexible interconnect circuit while forming the molded seal.

9. The flexible interconnect circuit assembly of claim 7, wherein the protector collar is formed from a material selected from the group consisting of nylon, a composite, steel, and aluminum.

10. The flexible interconnect circuit assembly of claim 1, further comprising a circuit carrier, wherein:

the flexible interconnect circuit is positioned within the circuit carrier, and the flexible interconnect circuit is supported by the circuit carrier.

11. The flexible interconnect circuit assembly of claim 10, wherein the molded seal is positioned between the flexible interconnect circuit and the circuit carrier.

12. The flexible interconnect circuit assembly of claim 10, wherein the circuit carrier comprises a cover and a base structure, coupled to the cover and forming an enclosure around the flexible interconnect circuit extending through the circuit carrier.

13. The flexible interconnect circuit assembly of claim 12, wherein the conductive traces comprise aluminum.

14. The flexible interconnect circuit assembly of claim 12, wherein the first insulator layer and the second insulator layer comprises one or more polymer selected from the group consisting of polyimide (PI), polyethylene naphthalate (PEN), polyethylene terephthalate (PET), polymethyl methacrylate (PMMA), ethyl vinyl acetate (EVA), polyethylene (PE), polyvinyl fluoride (PVF), polyamide (PA), and/or polyvinyl butyral (PVB).

15. A method of forming flexible interconnect circuit assembly, the method comprising:

providing a flexible interconnect circuit comprising a first insulator layer, a second insulator layer, conductive traces, wherein:

the first insulator layer and the second insulator layer define a first edge and a second edge of the flexible interconnect circuit, the conductive traces are positioned between the first insulator layer and the second insulator layer, and the conductive traces are offset relative to each other between the first edge and the second edge in a portion of the flexible interconnect circuit, the conductive traces are formed from a metal sheet, and the conductive traces have a uniform thickness throughout a boundary of the flexible interconnect circuit; and forming a molded seal over the portion of the flexible interconnect circuit, wherein:

the molded seal encloses the portion of the flexible interconnect circuit, the molded seal is overmolded or insert-molded over both the first insulator layer and the second insulator layer (a) such that the molded seal surrounds upper, lower, and side surfaces of the first insulator layer and the second insulator layer in the portion of the flexible interconnect circuit and (b) such that each of the first insulator layer and the second insulator layer is positioned between the molded seal and the conductive traces, at least some of the upper, lower, and side surfaces of the first insulator layer and the second insulator layer is exposed to environment away from the molded seal, and the molded seal is formed from a material selected from the group consisting of butyl, nitrile, styrene-butadiene rubber, polyvinyl chloride, vulcanized rubber, and ethylene propylene diene monomer rubber.

16. The method of claim 15, wherein:

the flexible interconnect circuit comprises a support tab comprising openings, forming the molded seal comprises positioning the flexible interconnect circuit into a molding cavity comprising pins, extending through the openings of the support tab, and the pins hold the flexible interconnect circuit in place while forming the molded seal, preventing deformation of the flexible interconnect circuit.

17. The method of claim 15, further comprising attaching connectors to the flexible interconnect circuit, wherein:

the conductive traces interconnect connector terminals in the connectors, and the portion of the flexible interconnect circuit enclosed by the molded seal is positioned between the connectors.

18. The method of claim 17, wherein the connectors are attached before forming the molded seal.

19. The method of claim 15, wherein forming the molded seal is performed using one or more techniques selected from the group consisting of overmolding and insert molding.

20. The method of claim 15, wherein forming the molded seal is performed using one or more techniques selected from the group consisting of injection molding, compression molding, transfer molding, single-shot molding, or multi-shot molding.

* * * * *